United States Patent
Yoshiki et al.

(10) Patent No.: US 8,012,676 B2
(45) Date of Patent: Sep. 6, 2011

(54) PROCESS FOR PREPARING CONDUCTIVE MATERIAL

(75) Inventors: Takenobu Yoshiki, Tokyo (JP); Shigeki Shino, Tokyo (JP); Kazuhisa Kobayashi, Tokyo (JP)

(73) Assignee: Mitsubishi Paper Mills Limited, Tokyo (JP)

( * ) Notice: Subject to any disclaimer, the term of this patent is extended or adjusted under 35 U.S.C. 154(b) by 304 days.

(21) Appl. No.: 12/305,929

(22) PCT Filed: Jun. 22, 2007

(86) PCT No.: PCT/JP2007/062561
§ 371 (c)(1),
(2), (4) Date: Dec. 19, 2008

(87) PCT Pub. No.: WO2007/148773
PCT Pub. Date: Dec. 27, 2007

(65) Prior Publication Data
US 2009/0233237 A1    Sep. 17, 2009

(30) Foreign Application Priority Data

Jun. 22, 2006 (JP) .................... 2006-172529
Jun. 27, 2006 (JP) .................... 2006-176037
Mar. 23, 2007 (JP) .................... 2007-077438

(51) Int. Cl.
G03C 1/00 (2006.01)
G03C 1/005 (2006.01)
G03C 5/26 (2006.01)
G03C 1/06 (2006.01)
G03F 7/00 (2006.01)

(52) U.S. Cl. ........ 430/496; 430/311; 430/380; 430/567; 430/620

(58) Field of Classification Search .................. 430/496, 430/567, 620, 380
See application file for complete search history.

(56) References Cited

U.S. PATENT DOCUMENTS

| | | | | |
|---|---|---|---|---|
| 5,458,753 | A | 10/1995 | Sato et al. | |
| 7,682,774 | B2 * | 3/2010 | Kim et al. | 430/281.1 |
| 7,749,686 | B2 * | 7/2010 | Ichiki et al. | 430/311 |
| 7,796,327 | B2 * | 9/2010 | Sasaki | 359/360 |
| 7,829,270 | B2 * | 11/2010 | Nakahira | 430/496 |
| 2003/0213614 | A1 | 11/2003 | Furusawa et al. | |
| 2007/0015094 | A1 * | 1/2007 | Habu | 430/348 |
| 2007/0138441 | A1 * | 6/2007 | Goto et al. | 252/500 |
| 2009/0020712 | A1 * | 1/2009 | Matsumoto | 250/515.1 |
| 2009/0098480 | A1 * | 4/2009 | Nakahira | 430/270.1 |
| 2009/0117346 | A1 * | 5/2009 | Nakahira | 428/195.1 |

FOREIGN PATENT DOCUMENTS

| | | |
|---|---|---|
| JP | 6-187833 A | 7/1994 |
| JP | 7-249316 A | 9/1995 |
| JP | 11-232939 A | 8/1999 |
| JP | 2004-6578 A | 1/2004 |
| JP | 2004-172041 A | 6/2004 |
| JP | 2004-207001 A | 7/2004 |
| JP | 2004-253329 A | 9/2004 |

OTHER PUBLICATIONS

Machine translation of JP 2004-207001 (no date).*
Machine translation of JP 2004-172041 (no date).*
Machine translation of JP 11-232939 (no date).*

* cited by examiner

*Primary Examiner* — Amanda C. Walke
(74) *Attorney, Agent, or Firm* — Birch, Stewart, Kolasch & Birch, LLP

(57) ABSTRACT

It is to provide a process for preparing a conductive material in which transparency and conductivity are both high, and storage stability is high, and further, in a process for preparing a conductive material utilizing ultra fine silver particles, to provide a process for preparing a conductive material having high conductivity without requiring a calcination step which has conventionally been required.

A process for preparing a conductive material having a conductive pattern containing silver on a support, which process for preparing a conductive material comprises acting at least one of the following mentioned (I) to (IV) on the pattern portion containing silver provided on the support:

(I) a reducing substance,
(II) a water-soluble phosphorus oxo acid compound,
(III) a water-soluble halogen compound,
(IV) warm water of 55° C. or higher.

20 Claims, No Drawings

PROCESS FOR PREPARING CONDUCTIVE MATERIAL

TECHNICAL FIELD

The present invention relates to a process for preparing a conductive material having a conductive pattern containing silver on a support.

BACKGROUND ART

In recent years, accompanying with rapid progress of an information-oriented society, techniques regarding information-related apparatuses have rapidly been progressed and spread. Of these, a display device has been used for television, for a personal computer, for an information display at a station, airport, etc., and for providing other various kinds of information. In particular, plasma display is attracted attention in recent years.

In such an information-oriented society, it has been worried about influence of an electromagnetic wave emitted by these display device. For example, it has been worried about influence on neighbouring electronic devices or influence on a human body. In particular, influence of an electromagnetic wave which exerts to health of a human body cannot ignore, and a strength of electromagnetic field emitted to the human body is required to be reduced. To comply with these demands, various transparent conductive materials to be used for an electromagnetic wave shielding material are developed, and there are disclosed in, for example, JP 9-53030A, JP 11-126024A, JP 2000-294980A, JP 2000-357414A, JP 2000-329934A, JP 2001-38843A, JP 2001-47549A, JP 2001-51610A, JP 2001-57110A, JP 200160416A, etc.

As processes for preparing these transparent conductive materials, there has generally been used a process in which a conductive metal such as silver, copper, nickel, indium, etc. is formed on a transparent resin film as a metal thin film by the method such as a sputtering method, ion plating method, ion beam assist method, vacuum deposition method, wet coating method, etc. However, according to these conventional methods, manufacturing processes become extremely complicated, so that they cause problems of high cost and poor productivity.

Also, as the other characteristics required to the transparent conductive material, there are conductivity and light transmittance. To heighten conductivity, it is necessary to prepare a metal thin film fine pattern having a width and thickness with a certain degree, but when a line width of a pattern comprising a metal which shields light is made thick, then a transmittance lowers. To comply with the both requirements simultaneously, it is necessary to prepare a fine metal pattern having sufficient conductivity, in particular, uniform pattern with a minimum width is required to be prepared, but this cannot be satisfied by the conventional methods.

For preparing a uniform pattern, in recent years, there has been proposed a method of using a silver salt light-sensitive photographic material containing a silver halide emulsion layer(s) as a precursor of the transparent conductive material. For example, in WO 01/51276A (Patent Literature 1) or JP 2004-221564A (Patent Literature 2), there have been proposed a process for preparing a transparent conductive material by pattern-wisely exposing a silver salt light-sensitive photographic material, subjecting to development, and then, subjecting to a metal plating treatment. As a method of using a silver salt light-sensitive material similarly, there has been proposed a method of using a silver salt diffusion transfer method, and there is, for example, JP 2003-77350A (Patent Literature 3), etc.

As a precursor for the conductive material, when a higher conductance is required in a conductive material using a silver salt light-sensitive photographic material, a metal plating treatment is carried out. However, when an electrolytic metal plating is to be applied to a particularly fine metal pattern, in the fine pattern, resistance of the pattern becomes too high for applying an electro-lytic plating to the fine pattern, whereby only a portion to which electricity is applied is occasionally plated. Accordingly, to carry out the electrolytic metal plating treatment uniformly, a process for preparing a conductive material, which gives high conductivity even in a fine metal pattern, has been required to be developed.

Moreover, in a conductive material using various kinds of silver salt light-sensitive photographic material as a precursor for the conductive material, conductivity is sometimes fluctuated during the preservation. As an example in which the above causes a problem, there is a ¼λ type electromagnetic absorber. In the ¼λ type electromagnetic absorber, it employs a structure in which a transparent resistance film which is equivalent to 377Ω/□ that is a characteristic impedance of a free space is provided at the position apart from ¼ of the wavelength λ of the electric wave absorbed from an electric wave reflecting material. In a conductive material using a silver salt light-sensitive photographic material as a precursor of the conductive material, a resistant material having high transparency can be prepared, but due to the problem of fluctuation of conductivity, the resistivity is deviated and the characteristics of the electromagnetic absorber is deteriorated during its preservation. As can be seen from this example, it has been required to provide a process for preparing a conductive material which has not only sufficiently high conductivity, but also high storage stability simultaneously.

The conductive material is further used in various fields such as shielding of infrared rays of construction materials or automobiles, antistatic materials for electronic devices or cell phones, heat rays of frosted glass, a wiring of circuit boards or IC cards, a coating for providing conductivity to resins, through hole, circuit itself, etc.

In particular, in preparation processes of a semiconductor device, liquid crystal display device, plasma display device, etc., a conductive metal thin film is sometimes to be formed to form an electrode or wiring, etc. In these preparation processes, the metal thin film is generally prepared by a thin film-forming method such as a vacuum deposition, sputtering, CVD method, etc. Such a thin film-forming method is generally carried out under an atmosphere of reduced pressure, so that a substrate, etc. is required to be provided in a reaction vessel such as a vacuum chamber, etc. Accordingly, an object to be formed by a metal thin film is larger, a vacuum chamber which can contain such a large sized object therein is necessary, whereby there is a problem that preparation of such a material is difficult.

Also, in the preparation of a flexible printed circuits, for forming a conductive part at a concave portion such as a contact hole or a via hole, etc., there is a case of using, for example, silver paste in which silver particles having a size of 1 μm or so are mixed and kneaded in a resin, but conductivity is ensured by contact of silver particles with each other, so that there is a problem that conductivity is low.

In JP 3-281783A (Patent Literature 4), there is disclosed a method in which paste having been dispersed metal ultra fine particles therein is coated, and after coating, this is sintered at a temperature of about 900° C. to form a metal thin film. According to this method, a metal thin film can be formed by coating paste, so that it is suitable for forming a metal thin film with a large area or forming a metal thin film on a support having a complicated surface shape.

Also, in JP 2001-35255A (Patent Literature 5), there is disclosed a ultra fine silver particles-independently dispersed liquid which comprises an organic solvent which evaporates at a drying-calcinating step for forming a silver wiring on a semiconductor substrate, and silver-containing ultra fine particles having a particle size of 0.01 μm or less being mixed, each surface of said ultra fine particles being covered by said organic solvent to be independently dispersed, a viscosity at room temperature being 50 mPa·s or lower. Thus, an extremely high conductivity can be obtained by calcinating the material at a temperature of 300° C. to give a silver thin film.

However, the metal colloid solution in which these metal ultra fine particles are dispersed in a liquid is prepared by evaporating a metal under reduced atmosphere, and monodispersibility is high, so that it is suitable for, for example, a nozzle type pattern forming device such as an ink-jet system, etc. However, for obtaining conductivity, a temperature of at least 200° C. is necessary, so that a usable substrate is limited to a heat-resistant support such as glass, polyimide, ceramic, etc.

On the other hand, it has been known a process for preparing metal ultra fine particles coated by a dispersant by reducing an aqueous silver nitrate solution, etc. with a reducing agent in the presence of a dispersant which is the so-called protective colloid.

For example, in American Journal of Science, Vol. 37, P476-491, 1889, M Carey Lea., there has been reported a method of obtaining a metal colloid solution which comprises citric acid or a salt thereof is added to an aqueous solution of a metal salt as a dispersant, a reducing agent such as a primary iron ion, etc. is then added to the same, and then, desalting and condensation are carried out. Also, in Experiments in Colloid Chemistry, 1940, p. 19, Hauser, E. A. and Lynn, J. E., there has been reported a method of obtaining a metal colloid solution using dextrin as a dispersant and as a reducing agent. However, even when a pattern formed by using these metal colloid solutions is sintered, a dispersant is difficultly evaporated so that the resulting conductivity was low.

Also, as metal ultra fine particles reduced in an aqueous solution and showing good conductivity, for example, there are disclosed, in JP 2002-338850A (Patent Literature 6), a metal colloid solution and a process for preparing the same which is prepared by using a polymerized material of a (thio) phenol derivatives) and to give a conductive film by calcinating under mild conditions. However, it was a metal colloid solution showing a high resistance value by calcinating at lower than 100° C. In JP 2005-081501A (Patent Literature 7), there are disclosed stable metal ultra fine particles and a process for pre-paring the same which can establish practically employable conductivity at a low temperature sintering. There is disclosed that practically employable conductivity can be established by calcination at 140 to 220° C., but the process yet requires the calcination step.

These metal ultra fine particles contained in the metal colloid solution are generally coated by a dispersant, so that in the state that a dispersing medium such as water, etc., has been evaporated by a drying step, connection between said metal ultra fine particles is not formed, whereby the resulting material does not show any conductivity, or extremely low even when it showed conductivity. Thus, to obtain good conductivity which can be used as a conductive material, it is necessary to carry out a calcination step to decompose and evaporate said dispersant, and to form mutual connection of said metal ultra fine particles due to fusion thereof, whereby not only an energy therefor is necessary but also a usable substrate is limited in the point of heat-resistance.

In order to develop conductivity without heating, or by low temperature heating, there has been carried out a device on a substrate. For example, in JP 2004-127851A (Patent Literature 8), there is disclosed a conductive film-complex material wherein a conductive film-complex material comprises laminated conductive films formed by drying metal colloid, and using an image receiving layer containing at least a porous inorganic filler, and in JP 2005-32458A (Patent Literature 9), there is disclosed a conductive film-complex material wherein the conductive film-complex material comprises laminated conductive films formed by drying a metal colloid solution on a substrate, and an intermediate layer comprising a water-soluble resin or hydrophilic resin and having a ten-point average surface roughness Rz according to JIS B 0601 is 3 μm or less is interposed between the conductive film and the substrate, and volume resistivity thereof is $10 \times 10^{-5}$ Ω·cm or less.

Patent Literature 1: WO 01/51276
Patent Literature 2: JP 2004-221564A
Patent Literature 3: JP 2003-77350A
Patent Literature 4: JP 3-281783A
Patent Literature 5: JP 2001-35255A
Patent Literature 6: JP 2002-338850A
Patent Literature 7: JP 2005-081501A
Patent Literature 8: JP 2004-127851A
Patent Literature 9: JP 2005-32458A

DISCLOSURE OF THE INVENTION

Problems to be Solved by the Invention

An object of the present invention is to provide a process for preparing a conductive material having both of high transparency and high conductivity, and also having high preservation stability, and further, in the process for preparing a conductive material utilizing ultra fine silver particles, to provide a process for preparing a conductive material having high conductivity without requiring a calcination step which has conventionally been required.

Means to Solve the Problems

The above-mentioned objects of the present invention have been accomplished by using the following means.
1. A process for preparing a conductive material having a conductive pattern containing silver on a support, which process for preparing a conductive material comprises acting at least one of the following mentioned (I) to (IV) on the pattern portion containing silver provided on the support:
(I) a reducing substance
(II) a water-soluble phosphorus oxo acid compound
(III) a water-soluble halogen compound
(IV) warm water of 55° C. or higher.
2. The process for preparing a conductive material according to the above-mentioned 1, wherein the pattern portion containing silver provided on the support is a pattern portion containing silver formed by pattern-wisely exposing a silver salt light-sensitive material having at least one silver halide emulsion layer on the support, and subjecting to development.
3. The process for preparing a conductive material according to the above-mentioned 2, wherein a half-value width of a peak at $2\theta=38.2°$ of the obtained conductive pattern by an X-ray diffraction method is 0.41 or less.

4. The process for preparing a conductive material according to the above-mentioned 1, wherein the pattern portion containing silver provided on the support is a pattern portion containing silver formed by providing ultra fine silver particles which have been dispersed in water and/or an organic solvent as a metal colloid to the support.

5. The process for preparing a conductive material according to the above-mentioned 4, wherein the support has a porous layer comprising inorganic fine particles and a binder in an amount of 80% by weight or less based on the amount of the inorganic fine particles on the substrate.

6. The process for preparing a conductive material according to the above-mentioned 4, wherein at least one of the above-mentioned (I) to (IV) is acted on the pattern portion containing silver provided on the support, and then, water is further supplied to.

Effects of the Invention

According to the present invention, in a preparation method which gives a conductive material having both of high transparency and high conductivity, and high storage stability, and further in a process for preparing a conductive material utilizing ultra fine silver particles, it can be provided a preparation process of obtaining a conductive material having high conductivity without requiring any calcination step which has conventionally been required.

BEST MODE TO CARRY OUT THE INVENTION

The conductive material in the present invention may be mentioned, for example, conductive patterns such as fine wiring, antenna, transparent electromagnetic wave shielding film, address electrode, etc., terminals such as bump, etc., contact hole(s) or via hole(s) between wiring pattern and wiring layer(s) of a print wiring substrate comprising a plural number of layers, battery electrode(s), electrode(s) of electronic part(s), etc., but the invention is not limited by these. With regard to conductivity, electroless plating or electrolytic plating is optionally further carried out to a conductive pattern of the conductive material obtained by the present invention to strengthen the same.

The present invention is a preparation process which is to obtain a conductive material having, on a support, a conductive pattern which has high conductivity by giving conductivity to a pattern portion containing silver provided on the support, or heightening conductivity of the portion. According to the preparation processes of a pattern portion containing silver, there exist a plural number of preferred embodiments. As the first embodiment of the present invention, there is mentioned an embodiment in which a pattern portion containing silver provided on a support is a pattern portion containing silver formed by patternwisely exposing a silver salt light-sensitive material having at least one silver halide emulsion layer on the support, and then, subjecting to development. As the second embodiment of the present invention, there is mentioned an embodiment in which the pattern portion containing silver provided on the support is a pattern portion containing silver formed by providing to the support ultra fine silver particles dispersed in water and/or an organic solvent as metal colloid, but the present invention is not limited by these embodiments.

The first embodiment of the present invention is explained.

In the present invention, a metal silver image which is a pattern portion containing silver derived from a silver salt light-sensitive material is treated by a post-treatment solution containing, for example, a water-soluble halogen compound, etc., to make it a metal silver image showing a narrower value of a half-value width measured by X-ray diffraction, and as a result, to make it a metal silver image which is a conductive pattern having both of high stability and high conductivity. Accordingly, even when a post-treatment solution is acted thereon before development which forms a metal silver image, or a post-treatment solution is acted thereon by stopping the development during which an image is forming, and then subjecting to development again, etc., there is no effect but rather causes bad effects whereby conductivity cannot be obtained.

In the present invention, a silver salt light-sensitive material which is a precursor of a conductive material is, after exposure, subjected to at least one of the developing method represented by the three methods of, (1) a development according to the silver salt diffusion transfer method, (2) a development which is to fix after direct development, and (3) a development according to curing development, whereby an image is formed. The method of (1) is a method disclosed in, for example, JP 42-23745B, the method of (2) is a method disclosed in, for example, U.S. Pat. No. 6,706,165B2, and the method of (3) is a method disclosed in, for example, J. Photo. Sci. No. 11, p. 1, written by A. G. Tull (1963) or "The Theory of the Photographic Process ($4^{th}$ edition, p326-327)", written by T. H. James, etc.

As mentioned above, the post-treatment of the present invention is to be applied after formation of an image. In the method of (1), the development steps of the conductive material are basically constituted by three steps wherein an image is precipitated by the silver salt diffusion transfer development, then, unnecessary silver halide emulsion layer is removed by a removal step by washing with water, and the conductive material is dried by a drying step. In the present invention, the post-treatment step is carried out at least after completion of the silver salt diffusion transfer development step, more preferably after completion of the removal step by washing with water and before the drying step. Also, it is preferred that washing is carried out after the post-treatment step so as to not precipitate the component(s) of the post-treatment solution on the surface of the conductive material, and then, subjecting to a drying treatment. In the method of (2), basic development steps comprise a direct development, fixing treatment, washing treatment and drying treatment, and the post-treatment step is to be carried out after completion of the direct development, more preferably after the fixing treatment, further preferably after the washing treatment which is after the fixing treatment, and before the drying step. Similarly in the method of (1), after the post-treatment step, washing and drying treatment are preferably carried out. In the method of (3), curing development and removal step by washing with water are constitutional elements of the basic development steps, and the post-treatment step is to be carried out after the curing development, preferably after completion of the removal step by washing with water and before the drying step. Similarly in the methods of (1) and (2), after the post-treatment step, washing and drying treatment are preferably carried out. Also, in either of the methods of (1), (2) and (3) of the present invention, a treatment with a neutralizing solution such as a stopping solution, etc., or washing step, drying step, etc. may be carried out between the respective treatment steps or before or after the same. Also, the development step may be divided into a plural number of steps, and different kinds of developing solutions may be used in the respective steps.

A metal silver image which is a conductive pattern of a conductive material prepared by the present invention preferably has a half-value width at $2\theta=38.2°$ according to X-ray diffraction of 0.41 or less, more preferably 0.35 or less. A lower limit of the half-value width is not necessarily determined but is 0.27 or more. If it has such a value, it becomes silver having high conductivity and high storage stability. Incidentally, the peak half-value width referred to in the present invention means a half-value width ($\beta_{1/2}$) determined by JIS K 0131-1996 "X-ray Diffraction Analysis General Rule". A unit of the half-value width is "rad" in the same JIS, "12. Measurement of size of crystallite and ununiform strain", but it is shown by "○" in the present specification. As a scanning method of the X-ray diffraction, there are a continuous scanning and a step scanning (step scanning method), and in the present invention, the step scanning giving high precision is used. Also, in the present invention, a sampling interval of the step scanning method is 0.01°, and the measurement is carried out for 1 second per 1 point. More specifically, it can be measured by using an X-ray diffraction device, MiniFlex (light source: CuKα rays. Output is 30 kV, 15 mA.) manufactured by Rigaku Corporation.

The post-treatment solution of the present invention preferably contains at least one of (I) reducing substance, (II) a water-soluble phosphorus oxo acid compound, or (III) a water-soluble halogen compound, but it may be (IV) warm water of 55° C. or higher which does not contain the above.

The reducing substance to be used in the post-treatment solution of the present invention means a substance which can reduce a silver ion, and a conventionally known developing agent in the filed of photographic development can be used. They are described in Research Disclosure Item 17643 (December, 1978), 18716 (November, 1979) and 308119 (December, 1989), or described in a literatures) cited therein. More specifically, there may be mentioned polyhydroxybenzenes such as hydroquinone, hydroquinone monosulfonic acid potassium, catechol, pyrogallol, methyl hydroquinone, chlorohydroquinone, etc., ascorbic acid and its derivatives), 3-pyrazolidones such as 1-phenyl-4,4-dimethyl-3-pyrazolidone, 1-phenyl-3-pyrazolidone, 1-phenyl-4-methyl-4-hydroxymethyl-3-pyrazolidone, etc., aminophenols such as paramethylaminophenol, paramethylaminophenol sulfate, paraminophenol, parahydroxyphenylglycine, etc., polyaminobenzenes such as paraphenylenediamine, etc., hydroxylamines, etc. Of these, preferred is ascorbic acid which has high water-solubility and less toxicity. Also, it can be used a reducing agent for reducing silver ions at the time of preparing metal ultra fine particles comprising silver, or a reducing agent to be used in electroless plating, there may be exemplified by ascorbic acid, ascorbic acid salts, erythorbic acid, erythorbic acid salts, citric acid, citrates, hydrazine, hydrazinium salts (hydrazinium sulfate, hydrazinium carbonate, etc.), saccharides (xylose, glucose, mannose, galactose, sorbose, glycerin, sorbitol, mannitol, etc. as a monosaccharide, and maltose, lactose, dextran, inulin, amylose, sucrose, dextrin, soluble starch, etc. as a polysaccharides), aldehydes (aliphatic saturated aldehydes such as formaldehyde, acetaldehyde, propionaldehyde, etc., aliphatic dialdehydes such as glyoxal, succinedialdehyde, glutaraldehyde, etc., unsaturated aldehydes such as acrolein, chrotonaldehyde, propiolaldehyde, etc., and others), alcohols (monovalent alcohols such as methanol, ethanol, etc., polyvalent alcohols such as glycols, etc., and others), thiourea dioxide, phosphinic acid and phosphinic acid salts, borohydrides (sodium borohydride, etc.), boron series reducing agents (dimethylamine borane, diethylamine borane, etc.), and the like.

In the post-treatment solution, these reducing substances are preferably used as an aqueous solution containing 1% by weight or more, preferably 5 to 30% by weight. Also, when the precursor for the conductive material is to be treated by the post-treatment solution containing a reducing substance, and if the treatment is carried out in the state that a reducible silver salt(s) is remained in the precursor for the conductive material, it causes occurrence of fog, etc. Accordingly, in particular, when a post-treatment solution containing a reducing substance is used, and when the above-mentioned (1) development according to the silver salt diffusion transfer method, or (3) development according to the curing development is used as the treatment method of the precursor for the conductive material, it is preferably carried out after the wash-removing step, and when the method of (2) a development which is to fix after direct development is used as the development step, it is preferably carried out after fixing.

In the present invention, as the water-soluble phosphorus oxo acid compound, there may be mentioned phosphorus oxo acids such as phosphoric acid, phosphorous acid, hypophosphoric acid, pyrophosphoric acid, tripolyphosphoric acid, hexametaphosphoric acid, etc., and a salt thereof, and ester compounds of these phosphorus oxo acids. A solubility of these water-soluble phosphorus oxo acid compounds to water at 25° C. is 0.1% by weight or more, preferably 1% by weight or more. Specific examples of these water-soluble phosphorus oxo acid compounds may be mentioned phosphates such as monosodium phosphate, monopotassium phosphate, disodium phosphate, etc., hypophosphites such as sodium hypophosphite, etc., pyrophosphates such as disodium dihydrogen pyrophosphate, etc., various kinds of conventionally known water-soluble phosphorus oxo acid compounds such as tripolyphosphate, hexametaphosphate, etc., or esters of water-soluble phosphorus oxo acid compounds such as polyoxyethylene alkyl ether phosphoric acid ester, alkyl phosphate, etc., and various kinds of phosphoric acid esters, etc. Of these, inorganic water-soluble phosphorus oxo acid compounds, and phosphates are preferred. In the post-treatment solution, these water-soluble phosphorus oxo acid compounds are to be used as an aqueous solution containing 5% by weight or more, preferably 10 to 30% by weight.

The water-soluble halogen compounds in the present invention are compounds which can release halide ions in an aqueous solution. In the present invention, a halogen to be possessed by the water-soluble halogen compound means fluorine, chlorine, bromine, iodine or astatine, more preferably chlorine, bromine or iodine, particularly preferably chlorine or bromine. As the water-soluble halogen compound of the present invention, any compound can be used so long as it has solubility to water at 25° C. of 0.1% by weight or more. As the water-soluble halogen compound to be used in the present invention, there may be mentioned hydrogen halides, inorganic and organic salts, inorganic and organic polymerized halides, etc.

As the hydrogen halide, there may be mentioned, hydrochloric acid, hydrobromic acid, hydroiodic acid, hydrofluoric acid, etc.

As the inorganic and organic salts, there may be mentioned a sodium salt, potassium salt, rubidium salt, calcium salt, aluminum salt, zirconium salt, ammonium salt, amine salt, etc. For example, there may be mentioned sodium chloride, potassium chloride, rubidium chloride, calcium chloride, ammonium chloride, sodium bromide, potassium bromide, calcium bromide, ammonium bromide, sodium iodide, potassium iodide, dimethylamine hydrochloride, trimethylamine hydrobromide, benzalkonium chloride, alkyl pyridinium hydrochloride, imidazolinium hydrochloride, etc.

As the inorganic polymer halides, there may be mentioned, for example, polyaluminum hydroxide which contains a polynuclear condensed ion which is basic and polymer stably, and those having halogen as a counter ion are used. This is available from Taki Chemical, K.K. as polyaluminum chloride (PAC), available from Rikengreen Co., Ltd. under the name of Pyurakemu WT, and available from other manufacturers in the same objects, and a product with various kinds of grades can be easily obtained. Incidentally, a polymerization degree thereof is optional.

As the organic polymer halides, cationic polymer compounds having halogen as a counter ion can be widely used. Incidentally, a composition and a polymerization degree thereof are optional. There may be mentioned, for example, cationic polyvinyl alcohol, diallyldimethyl-ammonium chloride polymerized product, diallyldimethyl-ammonium chloride-sulfur dioxide copolymerized product, diallyldimethylammonium chloride-acrylamide copolymerized product, diallyldimethylammonium chloride-diallylamine hydrochloride derivatives) copolymerized product, diallyl-aminehydrochloride-sulfur dioxide copolymerized product, hydrochlorides of diallylamine series polymerized product or allylamine series polymerized product such as diallyl-methylamine hydrochloride polymerized product, polyallylamine hydrochloride, etc., ammonium salts, polyamine series polymerized product, allyl series polymerized product, alkyl amine series polymerized product, dimethylamine epichlorohydrin polycondensated product, polyamide epichlorohydrin polymerized product, etc.

Of these, preferred is a compound having a halogen in the molecule by an ionic bond and capable of releasing a chloride ion in an aqueous solution, but hydrogen halide, etc. sometimes cause problems of corrosion of an apparatus to be treated or safety, so that a water-soluble inorganic salt such as sodium chloride, potassium chloride, calcium chloride, ammonium chloride, etc., is preferred. In the post-treatment solution, these water-soluble halogen compounds are preferably to be used as an aqueous solution containing 1% by weight or more, preferably 5 to 30% by weight.

The reducing substance, the water-soluble phosphorus oxo acid compound and the water-soluble halogen compound which are components of the post-treatment solution to be used in the present invention may be used alone, or in admixture of the same kind of components, for example, a reducing substance and another reducing substance, or in admixture of the different kind of components such as a reducing substance and a water-soluble halogen compound, etc. Of these, the water-soluble halogen compound is preferably used since efficiency of the post-treatment solution is high and storage stability or treatment stability of the post-treatment solution is high. A higher temperature of the post-treatment is preferable, but if it is not Tg of a substance to be used as a support for the conductive material or lower, the conductive material is sometimes elongated or broken during the treatment so that it is treated at a temperature of Tg or lower. Preferred treatment temperature is 30° C. or higher when the water-soluble halogen compound is used, or 40° C. or higher when the other substances are used, and more preferably treated at 50 to 70° C. in either of the substances, further preferably 60 to 70° C. A treatment time may vary depending on the components of the post-treatment solution, and by treating for 10 seconds or longer, preferably 30 seconds to 3 minutes, a half-value width at $2\theta=38.2°$ of the X-ray diffraction can be made in the preferred range. As the treatment method, there may be mentioned a dipping treatment, a method in which the post-treatment solution is applied by shower, coating, etc., and it is preferred to carry out the dipping treatment in view of stability of a temperature or difficultly causing crystallization of the components of the post-treatment solution. Also, after the post-treatment, it is preferred to carry out a washing treatment whereby crystallization of the components of the post-treatment solution on the surface of the conductive material is to be prevented.

A pH of the post-treatment solution of the present invention is 10 or less, preferably 4 to 9. In particular, when the reducing substance is to be used as the component of the post-treatment solution, if a pH is high, the reducing substance in the post-treatment solution is likely oxidized, whereby storage stability of the post-treatment solution becomes worse, so that a pH is preferably 8 or less in the post-treatment solution containing a reducing substance. To adjust a pH to a preferred range, a conventionally known pH buffer can be employed in the post-treatment solution. In the post-treatment solution to be used in the present invention, a conventionally known surfactant, defoaming agent, antiseptic agent, etc., may be contained in addition to the above.

In the present invention, a half-value width at $2\theta=38.2°$ of the X-ray diffraction can be also made in a preferred range when the post-treatment is carried out with warm water without containing the above-mentioned reducing substance, water-soluble phosphorus oxo acid compound or water-soluble halogen compound. However, the effect is weak in the warm water, so that it is necessary to carry out the treatment at a higher temperature and longer time than those of the post-treatment solution containing the above-mentioned compounds). More specifically, water temperature is 55° C. or higher, preferably 65° C. or higher, and it is preferred to treat the material at Tg of the support of the precursor for the conductive material or lower. The treatment time is 1 to 30 minutes, preferably 3 to 20 minutes. Warm water is not necessarily warm pure water, and a conventionally known surfactant, defoaming agent, antiseptic agent, etc. may be contained therein.

Next, a preparation method of the pattern portion containing silver provided on the support of the present invention is explained. As mentioned above, as the method of developing the precursor for the conductive material of the present invention, three methods of (1) development according to the silver salt diffusion transfer method, (2) a development which is to fix after direct development, and (3) development according to the curing development method can be used. In the following, the preparation method of the pattern portion containing silver using the development method of (1) according to the present invention is abbreviated to as Type 1, the preparation method of the pattern portion containing silver using the development method of (2) is Type 2, and the preparation method of the pattern portion containing silver using the development method of (3) is Type 3, and they are explained in this order.

<Type 1>

This is a method for preparing a pattern portion containing silver using a development method according to the silver salt diffusion transfer method. A precursor for the conductive material containing a silver halide emulsion layer is exposed, then, silver halide particles at an image portion which is an unexposed portion are dissolved by a soluble silver complex salt-forming agent and dissolved out as the soluble silver complex salt, and the soluble silver complex salt diffused on the physical development nuclei is reduced by a reducing agent (developing agent) such as hydroquinone, etc., to precipitate a metal silver whereby an image is formed. Thereafter, washing and removal are carried out to wash away the silver halide emulsion layer, etc., to form a pattern in which a silver image is image-wisely attached on the substrate.

As a precursor for the conductive material, at least a physical development nuclei layer and a silver halide emulsion layer are formed on a support in this order from the side nearer to the support. Moreover, a non-light-sensitive layer may be provided at an outermost layer farthest from the support and or as an intermediate layer between the physical development nuclei layer and the silver halide emulsion layer. These non-light-sensitive layers are layers which comprise hydrophilic polymer(s) as a main binder. As the hydrophilic polymer herein mentioned, any material can be optionally selected when the material swells easily by a developing solution, and can easily penetrate the developing solution into the silver halide emulsion layer and the physical development nuclei layer provided as underlayers.

More specifically, gelatin, albumin, casein, polyvinyl alcohol, etc. can be used. Preferred hydrophilic binder is a protein such as gelatin, albumin, casein, etc. To obtain the effects of the present invention sufficiently, an amount of the binder in the non-light-sensitive layer is preferably in the range of 20 to 100% by weight based on the total binder amount in the silver halide emulsion layer, more preferably 30 to 80% by weight.

In these non-light-sensitive layers, a conventionally known additive(s) for photography as described in Research Disclosure Item 17643 (December, 1978), 18716 (November, 1979) and 308119 (December, 1989) may be contained, if necessary. Also, it is possible to cure the film by a cross-linking agent as long as peeling of the silver halide emulsion layer after the treatment is not prevented.

As the physical development nuclei in the physical development nuclei layer of the precursor for the conductive material of Type 1, fine particles (particle size is 1 to several tens nm or so) comprising a heavy metal or its sulfide are used. There may be mentioned, for example, a colloid of gold, silver, etc., or a metal sulfide in which a water-soluble salt of palladium, zinc, etc. and a sulfide are mixed, etc. are mentioned, and a silver colloid and palladium sulfide nuclei are preferred. These fine particle layers of the physical development nuclei can be formed on the plastic resin film by a vacuum deposition method, cathode sputtering method, coating method, etc., and a coating method is preferably used in view of production efficiency. A content of the physical development nuclei in the physical development nuclei layer is suitably 0.1 to 10 mg or so per 1 $m^2$ in terms of the solid component.

In the physical development nuclei layer, a hydrophilic binder may be contained. An amount of the hydrophilic binder is preferably 10 to 500% by weight or so based on the amount of the physical development nuclei. As the hydrophilic binder, there may be used gelatin, Gum Arabic, cellulose, albumin, casein, sodium alginate, various kinds of starch, polyvinyl alcohol, polyvinylpyrrolidone, polyacrylamide, a copolymer of acrylamide and vinylimidazole, etc. Preferred hydrophilic binder is a protein such as gelatin, albumin, casein, etc.

The physical development nuclei layer preferably contains one or two or more kinds of, for example, an inorganic compound such as chromium alum, aldehydes such as formaldehyde, glyoxal, malealdehyde, glutaraldehyde, etc., an N-methylol compound such as urea and ethyleneurea, etc., an equivalent of the aldehyde such as mucochloric acid, a compound having an active halogen such as 2,3-dihydroxy-1,4-dioxane, 2,4-dichloro-6-hydroxy-s-triazine salt and 2,4-dihydroxy-6-chloro-triazine salt, divinylsulfone, divinyl ketone or N,N,N-triacryloylhexahydrotriazine, a compound having two or more ethyleneimino groups or epoxy groups which are an active three-membered ring in the molecule, a cross-linking agent (film-hardening agent) of various kinds of proteins such as dialdehyde starch, etc., as a polymer film-hardening agent. Of these cross-linking agents, preferred are dialdehydes such as glyoxal, glutaraldehyde, 3-methylglutaraldehyde, succine aldehyde, adipoaldehyde, etc., and more preferred cross-linking agent is glutaraldehyde. The cross-linking agent is preferably contained in the physical development nuclei layer in an amount of 0.1 to 30% by weight, more preferably 1 to 20% by weight based on the total protein amount contained in the following mentioned base layer and the physical development nuclei layer.

In a precursor for the conductive material of Type 1, it is preferred to have a base layer (protein-containing base layer; hereinafter merely referred to as "base layer") comprising a protein between the physical development nuclei layer and the transparent support. It is preferred to further form an easily adhering layer comprising vinylidene chloride or polyurethane, etc., between the transparent support and the base layer. As the protein to be used in the base layer, gelatin, albumin, casein or a mixture thereof is preferably used. A content of the protein in the base layer is preferably 10 to 300 mg per 1 $m^2$.

For coating the physical development nuclei layer or the base layer, there may be employed, for example, a dip coating, slide coating, curtain coating, bar coating, air knife coating, roller coating, gravure coating, spray coating, etc.

In the precursor for the conductive material of Type 1, a silver halide emulsion layer is provided as a photosensor. Techniques to be used in a silver salt photographic film regarding silver halide or a photographic printing paper, a film for printing plate-making, an emulsion mask for a photomask, etc., can be used as such.

For formation of the silver halide emulsion particles to be used in the silver halide emulsion layer, there may be employed a conventionally known manner as disclosed in Research Disclosure Item 17643 (December, 1978), 18716 (November, 1979), and 308119 (December, 1989) such as normal mixing, reverse mixing, simultaneous mixing, etc. Of these, it is preferred to use the so-called controlled double jet method which is a kind of the simultaneous mixing methods, and a pAg in the liquid phase in which particles are formed is kept constant, since silver halide emulsion particles with uniform particle size can be obtained. In the present invention, a preferred average particle size of the silver halide emulsion particles is 0.25 μm or less, more preferably 0.05 to 0.2 μm. There exists a preferred range in a halide composition of the silver halide emulsion to be used in the present invention, and those containing 80 mol % or more of a chloride are preferred, and more preferably 90 mol % or more is a chloride.

In the preparation of the silver halide emulsion, in the course of formation or physical ripening of the silver halide particles, a salt of Group VIII metal element or its complex salt such as sulfites, lead salt, thallium salt, or rhodium salt or its complex salt, iridium salt or its complex salt, etc., may be copresented, if necessary. Also, it can be sensitized by various kinds of chemical sensitizer, and a generally employed method in this field of the art such as the sulfur sensitization method, selenium sensitization method, noble metal sensitization method, etc., can be used singly or in combination. Moreover, in the present invention, the silver halide emulsion may be subjected to dye sensitization, if necessary.

Also, a ratio of a silver halide amount and a gelatin amount contained in the silver halide emulsion layer is preferably a weight ratio of silver halide (in terms of silver) and gelatin (silver/gelatin) of 1.2 or more, more preferably 1.5 or more.

In the silver halide emulsion layer, for various kinds of purposes, conventionally known additives for photography may be further used. They are described in Research Disclosure Item 17643 (December, 1978), 18716 (November, 1979) and 308119 (December, 1989), or described in cited literatures.

As a support to be used in the precursor for the conductive material of Type 1, a transparent support is used when the obtained conductive material is to be used for a transparent conductive film such as a transparent electromagnetic wave shielding film, etc., and there may be mentioned, for example, a polyester resin such as polyethylene terephthalate, etc., a plastic resin film such as diacetate resin, triacetate resin, acrylic resin, poly-carbonate resin, polyvinyl chloride, polyimide resin, cellophane, celluloid, etc., a glass plate, etc. Moreover, in the present invention, a base layer or an antistatic layer, etc., to improve adhesiveness with a silver halide photographic emulsion layer may be provided on the support, if necessary.

To make the precursor for the conductive material of the above-mentioned Type 1 a conductive material, a method for preparing a pattern portion containing silver may be mentioned, for example, formation of a silver thin film with a mesh-like pattern. In this case, the silver halide emulsion layer is exposed with a mesh-like pattern. As the exposing method, there are a method of exposing by contacting a transparent manuscript with a mesh-like pattern and the silver halide emulsion layer, or a method of subjecting to scanning exposure by using various kinds of laser beam, etc. In the above-mentioned method of exposing with laser beam, it can use, for example, blue semiconductor laser (which is also called as violet laser diode) having an oscillation wavelength of 400 to 430 nm.

In the precursor for the conductive material of Type 1, a non-sensitizing dye or pigment having an absorption maximum in the light-sensitive wavelength region of the silver halide emulsion layer is preferably used as an antis halation or anti-irradiation agent for improving image quality. The anti-halation agent is preferably contained in the above-mentioned base layer or physical development nuclei layer, or an intermediate layer provided depending on necessity between the physical development nuclei layer and the silver halide emulsion layer, or in a back-coating layer provided by interposing the support. The anti-irradiation agent is preferably contained in the silver halide emulsion layer. An amount thereof to be added may vary in a wide range so long as the objective effects can be obtained, and, for example, when it is contained in the back-coating layer as an anti-halation agent, it is desirably in the range of about 20 mg to about 1 g per 1 $m^2$, and an optical density at the maximum absorption wavelength is preferably 0.5 or higher.

After contacting a transparent manuscript with an optional shaped pattern such as a mesh-like pattern and the above-mentioned precursor and subjecting to exposure, or, subjecting to scanning exposure a digital image with an optional shaped pattern to the above mentioned precursor with various kinds of laser beam output machine, the material is treated with a silver salt diffusion transfer developing solution so that physical development occurs, whereby the silver halide at the unexposed portion is dissolved to give a silver complex salt, and reduced on a physical development nuclei to precipitate metal silver to give a silver thin film with a shaped pattern. On the other hand, the exposed portion is chemically developed in the silver halide emulsion layer to give black silver. After the development, the silver halide emulsion layer which became unnecessary, the intermediate layer and the protective layer are removed by washing with water, whereby a silver thin film with a shaped pattern is exposed on the surface.

The removing method of the layers provided on the physical development nuclei layer such as the silver halide emulsion layer, etc., after the development may include a method of removing by washing with water or a method of transferring the layers to peeling paper, etc., and peeling off. As the removal by washing with water, there may be mentioned a method of removing by using a scrabbling roller, etc., while spreading warm water as a shower, or a method of removing by a force of water while jet spraying warm water through a nozzle, etc. Also, in the method of peeling by transcription with peeling paper, etc., an excess alkali solution (developing solution for silver complex salt diffusion transfer) on the silver halide emulsion layer is previously squeezed with a roller, etc., then, the silver halide emulsion layer, etc., and the peeling paper are contacted to transfer the silver halide emulsion layer, etc., from the plastic resin film to the peeling paper and the paper is peeled off. As the peeling paper, there may be used paper or non-woven fabric having a water absorption property, or a material in which a water-absorptive void layer comprising a fine particle pigment such as silica and a binder such as polyvinyl alcohol is provided on paper.

Next, the developing solution of the silver salt diffusion transfer development is explained. The developing solution is an alkali solution containing a soluble silver complex salt-forming agent and a reducing agent. The soluble silver complex salt-forming agent is a compound which dissolves a silver halide to form a soluble silver complex salt, and the reducing agent is a compound which reduces the soluble silver complex salt to precipitate metal silver on the physical development nuclei.

As the soluble silver complex salt-forming agent to be used in the developing solution, there may be mentioned thiosulfates such as sodium thiosulfate and ammonium thiosulfate, thiocyanates such as sodium thiocyanate and ammonium thiocyanate, sulfites such as sodium sulfite and potassium hydrogen sulfite, oxazolidones, 2-mercaptobenzoic acid and its derivatives, cyclic imides such as uracil, alkanolamines, diamines, mesoionic compounds disclosed in JP 9-171257A, thioethers disclosed in U.S. Pat. Nos. 5,200,294, 5,5-dialkylhydantoins, alkyl sulfones, and other compounds disclosed in "The Theory of the photographic Process ($4^{th}$ edition, p474 to 475)", written by T. H. James.

Of these soluble silver complex salt-forming agents, an alkanolamine is more preferred. Surface resistance of a conductive material subjected to development with a treating solution containing an alkanolamine gives a relatively low value.

As the alkanolamine, there may be mentioned, for example, N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N-ethyl-2,2'-imino-diethanol, 2-methylaminoethanol, 2-amino-2-methyl-1-propanol, etc.

These soluble silver complex salt-forming agents may be used alone, or in combination of a plural number of these.

The reducing agent to be used in the developing solution may be used a developing agent conventionally known in the field of the photographic development as disclosed in Research Disclosure Item 17643 (December, 1978), 18716 (November, 1979) and 308119 (December, 1989). There may be mentioned, for example, polyhydroxybenzenes such as hydroquinone, catechol, pyrogallol, methylhydroquinone, chlorohydroquinone, etc., ascorbic acid and its derivatives, 3-pyrazolidones such as 1-phenyl-4,4-dimethyl-3-pyrazolidone, 1-phenyl-3-pyrazolidone, 1-phenyl-4-methyl-4-hydroxymethyl-3-pyrazolidone, etc., paramethylaminophenol, paraminophenol, parahydroxyphenylglycine, paraphenylenediamine, etc. These reducing agents may be used alone, or in combination of a plural number of these.

A content of the soluble silver complex salt-forming agent is preferably 0.001 to 5 mol per liter of the developing solution, more preferably in the range of 0.005 to 1 mol. A content of the reducing agent is preferably 0.01 to 1 mol per liter of the developing solution, more preferably in the range of 0.05 to 1 mol.

A pH of the developing solution is preferably 10 or higher, and 11 to 14 are more preferred. To adjust a pH to a desired range, an alkali agent such as sodium hydroxide, potassium hydroxide, etc., a buffer such as phosphoric acid, carbonic acid, etc., are contained alone, or in combination. Also, in the developing solution of the present invention, a preservative such as sodium sulfite and potassium sulfite, etc., is preferably contained.

<Type 2>

This is a method of preparing a pattern portion containing silver by using direct development. For example, when a negative emulsion is used, the silver halide particles as a photosensor is imagewisely exposed to form a latent image, and the silver halide is reduced with a reducing agent such as hydroquinone, etc., in the developing solution using the latent image as a catalyst, to form metal silver. Thereafter, the silver halide at the unexposed portion is removed by a fixing treatment, whereby a pattern comprising silver particles retained in the image-wise binder is formed on the support.

As a support to be used for the precursor of the conductive material of Type 2, those of the material and having the characteristics explained in the precursor for the conductive material of Type 1 can be used.

In the precursor for the conductive material of Type 2, a silver halide emulsion layer is provided on a support as a photosensor, and a halogen element contained in the silver halide of the silver halide emulsion layer may be either of chlorine, bromine, iodine or fluorine, and may be used in combination. For formation of the silver halide emulsion particles, there may be used a method of the normal mixing, reverse mixing, simultaneous mixing, etc. Of these, it is preferred to use the so-called controlled double jet method since silver halide emulsion particles with uniform particle size can be obtained. An average particle size of the preferred silver halide emulsion particles is 0.25 µm or less, more preferably 0.05 to 0.2 µm.

A shape of the silver halide particles is not specifically limited, and, for example, it may be various shapes such as spherical, cubic, tabular (hexagonal tabular, triangular tabular, square tabular, etc.), octahedral, tetradecahedral, etc.

In the preparation of the silver halide emulsion, in the course of formation or physical ripening of the silver halide particles, a salt of Group VIII metal element or its complex salt such as sulfites, lead salt, thallium salt, or rhodium salt or its complex salt, iridium salt or its complex salt, etc., may be copresented, if necessary. Also, it can be sensitized by various kinds of chemical sensitizer, and a generally employed method in this field of the art such as the sulfur sensitization method, selenium sensitization method, noble metal sensitization method, etc., can be used singly or in combination. Moreover, in the present invention, the silver halide emulsion may be subjected to dye sensitization, if necessary.

The silver halide emulsion layer contains a binder. As the binder, both of a non-water-soluble polymer and a water-soluble polymer may be used as a binder, and a water-soluble polymer is preferably used. Preferred water-soluble polymer may be mentioned, for example, gelatin, polyvinyl alcohol (PVA), polyvinylpyrrolidone (PVP), polysaccharides such as starch, etc., cellulose and its derivatives), polyethyleneoxide, polyvinylamine, chitosan, polylysin, polyacrylic acid, polyalginic acid, polyhyaluronic acid, carboxyl cellulose, etc.

In the silver halide emulsion layer, a polymer latex as a non-water-soluble polymer can be used in addition to the above mentioned water-soluble polymer. As the polymer latex, various kinds of conventionally known latexes such as a homopolymer or a copolymer, etc., can be used. As the homopolymer, there are polyvinyl acetate, polyvinyl chloride, polystyrene, polymethyl acrylate, polybutyl acrylate, polymethacrylonitrile, polybutadiene, polyisoprene, etc., and as the copolymer, there are ethylene•butadiene copolymer, styrene•butadiene copolymer, styrene•p-methoxystyrene copolymer, styrene•vinyl acetate copolymer, vinyl acetate•vinyl chloride copolymer, vinyl acetate•diethyl maleate copolymer, methyl methacrylate•acrylonitrile copolymer, methyl methacrylate•butadiene copolymer, methyl methacrylate•styrene copolymer, methyl methacrylate•vinyl acetate copolymer, methyl methacrylate•vinylidene chloride copolymer, methyl acrylate•acrylonitrile copolymer, methyl acrylate•butadiene copolymer, methyl acrylate•styrene copolymer, methyl acrylate•vinyl acetate copolymer, acrylic acid•butyl acrylate copolymer, methyl acrylate•vinyl chloride copolymer, butyl acrylate-styrene copolymer, etc. An average particle size of the polymer latex to be used in the silver halide emulsion layer is preferably 0.01 to 1.0 µm, more preferably 0.05 to 0.8 µm.

When an amount of the polymer latex to be used is too much, it exerts a bad effect on a coating property, so that a weight ratio (polymer latex/water-soluble polymer) with the water-soluble polymer is preferably 1.0 or less. Also, with regard to a total amount of the polymer latex and the water-soluble polymer contained in the silver halide emulsion layer, i.e., a total binder amount, when the binder amount is a little, it exerts a bad effect on a coating property and stable silver halide particles can hardly be obtained, while it is too much, conductivity cannot be obtained otherwise a large amount of plating is carried out, so that it exerts a great effect on the quality, e.g., a productivity is lowered, etc. Preferred weight ratio (silver/total binder) of the silver halide (in terms of silver) and the total binder is 1.2 or more, more preferably 1.5 to 3.5.

The silver halide emulsion layer of the precursor for the conductive material to be used in Type 2 is preferably cured by a film-hardening agent. As the film-hardening agent, there may be used, for example, inorganic compounds such as chromium alum, aldehydes such as formaldehyde, glyoxal, malealdehyde and glutaraldehyde, N-methylol compounds such as urea and ethylene urea, etc., aldehyde equivalents such as mucochloric acid, 2,3-dihydroxy-1,4-dioxane, etc., compounds having active halogen such as 2,4-dichloro-6-hydroxy-s-triazine salt, 2,4-dihydroxy-6-chloro-triazine salt, etc., divinylsulfone, divinylketone or N,N,N-triacryloyl-hexahydrotriazine, compounds having two or more ethylene-imino groups or epoxy groups which are active tri-membered ring in the molecule, dialdehyde starch as a polymer film-hardening agent, etc., and other substances as disclosed in Research Disclosure Item 17643 (December, 1978), 18716 (November, 1979) and 308119 (December, 1989). Also, the film-hardening agent may be used alone or in combination of two or more in admixture. The film-hardening agent is preferably contained in an amount of 0.1 to 10% by weight based on the amount of the binder to be contained in the silver halide emulsion layer, and more preferably 0.5 to 8% by weight.

In the silver halide emulsion layer, similar conventionally known additives for photography as in Type 1 can be further used for various kinds of purposes.

In the precursor for the conductive material of Type 2, if necessary, a back-coating layer may be provided on an opposite surface of the support to that of the silver halide emulsion layer, or an over layer, etc., on the silver halide emulsion layer. Also, in the precursor for the conductive material of Type 2, a non-sensitizing dye or pigment having an absorption maximum in the light-sensitive wavelength region of the silver halide emulsion layer which is the same as explained in Type 1 may be contained in the same purpose and method.

To make the precursor for the conductive material of Type 2 a conductive material, as a process for preparing a pattern portion containing silver, there may be mentioned, for example, formation of a silver thin film having a mesh-like pattern, and this can be exposed by the method explained in Type 1.

After the precursor for the conductive material of Type 2 is exposed, at least development, fixing treatment, and washing treatment are carried out.

The developing solution to be used in Type 2 comprises a developing agent, a preservative, an alkali agent and an antifogging agent as a basic composition. As the developing agent, there may be specifically mentioned hydroquinone, ascorbic acid, p-aminophenol, p-phenylene-diamine, phenidone, etc. A part thereof may be contained in the precursor for the conductive material. As the preservative, there are sulfurous acid ion, etc. The alkali agent is necessary to show reductive property of the developing agent, and so added that a pH of the developing solution is made 9 or higher, preferably 10 or higher. Also, a buffer such as a carbonate or phosphate is used to maintain the basis property stably. Moreover, as the antifogging agent which is added to prevent the silver halide particles having no development nuclei from reduction, there may be mentioned a bromide ion, benzimidazole, benzotriazole, 1-phenyl-5-mercaptotetrazol, etc.

Further, as a developing solution used in Type 2, it is preferred to contain a soluble silver complex salt-forming agent for obtaining high conductivity. As the soluble silver complex salt-forming agent, there may be more specifically mentioned thiosulfates such as ammonium thiosulfate and sodium thiosulfate, thiocyanates such as sodium thiocyanate and ammonium thiocyanate, sulfites such as sodium sulfite and potassium hydrogen sulfite, thio ethers such as 1,10-dithia-18-crown-6,2,2'-thiodiethanol, etc., oxazolidones, 2-mercaptobenzoic acid and its derivative(s), cyclic imides such as uracil, alkanolamines, diamines, mesoionic compounds disclosed in JP 9-171257A, 5,5-dialkylhydantoins, alkyl sulfones, and other compounds disclosed in "The Theory of the photographic Process ($4^{th}$ edition, p 474 to 475)", written by T. H. James.

Of these soluble silver complex salt-forming agents, an alkanolamine is more preferred. As the alkanolamine, there may be mentioned, for example, N-(2-aminoethyl)-ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N-ethyl-2,2'-iminodiethanol, 2-methylamino-ethanol, 2-amino-2-methyl-1-propanol, etc.

These soluble silver complex salt-forming agents may be used alone, or in combination of a plural number of them. Also, an amount of the soluble silver complex salt-forming agent to be used is 0.1 to 40 g/L, preferably 1 to 20 g/L. The development treatment temperature is generally selected in the range of 15° C. to 45° C., more preferably 25° C. to 40° C.

The fixing treatment is to be carried out for the purpose of stabilization by removing the silver salt at the undeveloped portion. In the fixing treatment, techniques of the fixing treatment to be used in the conventionally known silver salt photographic film or a photographic printing paper, a film for printing plate-making, an emulsion mask for a photomask, etc., can be used, and a fixing solution described on p. 321 of "Chemistry of Photography" (written by Sasai, published by Shashin Kogyo Co., Ltd.), etc., may be mentioned.

Of these, a fixing solution containing a desilvering agent other than thiosulfate is preferred. As the desilvering agent at that time, there may be mentioned sodium thiocyanate and cyanic acid, cyanic acid or thio-cyanates such as ammonium thiocyanate, sulfites such as sodium sulfite and potassium hydrogen sulfite, thio ethers such as 1,10-dithia-18-crown-6, 2,2'-thiodiethanol, etc., oxazolidones, 2-mercaptobenzoic acid and its derivative(s), cyclic imides such as uracil, alkanolamine, diamine, a mesoionic compound as described in JP 9-171257A, 5,5-dialkylhydantoins, alkyl sulfones, and other compounds described in "The Theory of the photographic Process ($4^{th}$ edition, p. 474 to 475)", written by T. H. James.

Of these desilvering agents, an alkanolamine is more preferred. As the alkanolamine, it is the same meaning as that of the soluble silver complex salt-forming agent mentioned in the diffusion transfer developing solution. Also, thiocyanates have high desilvering ability but it is not preferably used in the viewpoint of safety to human body.

These desilvering agents can be used alone, or in combination of a plural number thereof. Also, an amount of the desilvering agent to be used is preferably 0.01 to 5 mol of the total desilvering agents per liter of the fixing solution per, more preferably in the range of 0.1 to 3 mol.

As the fixing solution, in addition to the desilvering agent, it may contain a sulfite or a bisulfite as the preservative, and acetic acid, amine borate, phosphate, etc., as a pH buffer. Also, a water-soluble aluminum (for example, aluminum sulfate, aluminum chloride, potassium alum, etc.) may be contained as a film-hardening agent, and a polybasic acid (for example, tartaric acid, potassium tartarate, sodium tartarate, sodium citrate, lithium citrate, potassium citrate, etc.) may be also contained as a precipitation-preventing agent of aluminum. A preferred pH of the fixing solution varies depending on a kind of the desilvering agent, and it is 8 or higher when an amine is to be used, preferably 9 or higher. The fixing treatment temperature is usually selected between 10° C. and 45° C., preferably 18 to 30° C.

<Type 3>

This is a method of preparing a pattern portion containing silver using a curing development method. In this method, silver halide particles of the photosensor are imagewisely exposed to form a latent image, and when the silver halide is reduced using the latent image as a catalyst, a reducing agent in which its oxidized product has a curing action of gelatin, such as hydroquinone, etc., is used, to form metal silver and simultaneously cure the gelatin around the metal silver, whereby an image is formed, and then, the material is washed with water to remove the non-curing portion. Similarly as in Type 2, the silver particles are retained in the binder, and only the support remains at the non-image portion.

As the support to be used in the precursor for the conductive material used in Type 3, a similar support to be used in the precursor for the conductive material of Type 1 or Type 2 can be used.

In the precursor for the conductive material of Type 3, a silver halide emulsion layer is provided on the support as a photosensor.

As the silver halide, a similar silver halide to be used in the precursor for the conductive material of Type 2 can be used.

The silver halide emulsion layer contains a binder. As the binder, both of a non-water-soluble polymer and a water-soluble polymer can be used, and a water-soluble polymer is preferably used. As the preferred binder in the present invention, there may be mentioned, for example, proteins such as gelatin, casein, etc., polyvinyl alcohol (PVA), polyvinylpyrrolidone (PVP), polysaccharides such as starch, etc., cellulose and its derivatives, polymethyleneoxide, polyvinylamine, chitosan, polylysin, polyacrylic acid, alginic acid, hyaluronic acid, carboxyl cellulose, etc. Of these water-soluble polymers, proteins such as gelatin, etc. are preferred.

In the silver halide emulsion layer, in addition to the above-mentioned water-soluble polymer, a polymer latex as a non-water-soluble polymer may be used. As the polymer latex, various kinds of known latex such as a homopolymer or a copolymer, etc., can be used. As the homopolymer, there may be mentioned polyvinyl acetate, polyvinyl chloride, polystyrene, polymethyl acrylate, polybutyl acrylate, polymethacrylonitrile, polybutadiene, polyisoprene, etc., and as the copolymer, there may be mentioned ethylene•butadiene copolymer, styrene•butadiene copolymer, styrene•p-methoxystyrene copolymer, styrene•vinyl acetate copolymer, vinyl acetate•vinyl chloride copolymer, vinyl acetate•diethyl maleate copolymer, methyl methacrylate•acrylonitrile copolymer, methyl methacrylate•butadiene copolymer, methyl methacrylate•styrene copolymer, methyl methacrylate•vinyl acetate copolymer, methyl methacrylate•vinylidene chloride copolymer, methyl acrylate•acrylonitrile copolymer, methyl acrylate•butadiene copolymer, methyl acrylate•styrene copolymer, methyl acrylate•vinyl acetate copolymer, acrylic acid•butyl acrylate copolymer, methyl acrylate•vinyl chloride copolymer, butyl acrylate•styrene copolymer, etc. An average particle size of the polymer latex to be used in the present invention is preferably 0.01 to 1.0 μm, more preferably 0.05 to 0.8 μm.

With regard to a total amount of the water-soluble polymer and the polymer latex contained in the silver halide emulsion layer, i.e., the total binder amount, when the binder amount is a little, it exerts a bad effect on a coating property and stable silver halide particles can hardly be obtained, while it is too much, conductivity cannot be obtained, so that it exerts a great effect on the quality, e.g., a productivity is lowered, etc. A preferred weight ratio of the silver halide (in terms of silver) and the total binder (silver/total binder) is 0.5 or more, more preferably 1.5 to 3.5. Also, a preferred total binder amount is 0.05 to 3 $g/m^2$, more preferably 0.1 to 1 $g/m^2$.

In the silver halide emulsion layer, conventionally known additives for photography can be used for various kinds of purposes similarly in the precursor for the conductive material of Type 2.

In the precursor for the conductive material of Type 3, if necessary, a back-coating layer may be provided on an opposite surface of the support to that of the silver halide emulsion layer, or an over layer on the silver halide emulsion layer or a subbing layer, etc., under the silver halide emulsion layer. Also, similarly in the precursor for the conductive material of Type 1 or Type 2, a light-sensitive wavelength region of the silver halide emulsion layer may contain non-sensitizing dye or pigment having an absorption maximum.

With regard to the over layer and subbing layer of the precursor for the conductive material of Type 3, a similar binder as in the silver halide emulsion layer can be used. A preferred amount of the binder varies depending on the purpose for use of the respective layers, and when one wish to cure these layers imagewisely by utilizing curing development and to remain necessary portions alone, for example, when catalytic nuclei of the electroless plating are contained in the over layer, etc., it utilizes a curing reaction occurring in the silver halide emulsion layer so that it is preferred to make the layer as thin as possible. Preferred amount to be used is 0.1 $g/m^2$ or less, more preferably 0.05 to 0.001 $g/m^2$. Moreover, a conventionally known surfactant, development controlling agent, irradiation-preventing dye, pigment, matte agent, lubricant, etc., may be contained in the over layer or subbing layer.

In the precursor for the conductive material of Type 3, it is more preferred to contain a curing development agent. As the curing development agent, there may be mentioned polyhydroxybenzenes, for example, hydroquinone, catechol, chlorohydroquinone, pyrogallol, bromohydroquinone, isopropylhydroquinone, toluhydroquinone, methylhydroquinone, 2,3-dichlorohydroquinone, 2,3-dimethylhydroquinone, 2,3-dibromohydroquinone, 1,4-dihydroxy-2-acetophenone, 2,5-dimethylhydroquinone, 4-phenylcatechol, 4-t-butylcatechol, 4-s-butylpyrogallol, 4,5-dibromocatechol, 2,5-diethylhydroquinone, 2,5-benzoylaminohydroquinone, etc. Also, an aminophenol compound, for example, N-methyl-p-aminophenol, p-aminophenol-2,4-diaminophenol, p-benzylaminophenol, 2-methyl-p-aminophenol, 2-hydroxymethyl-p-aminophenol, etc., and the other conventionally known curing development agents as disclosed in, for example, JP 2001-215711A, JP 2001215732A, JP 2001-312031A, JP 2002-62664A can be used, and a substituted benzene in which hydroxyl groups are substituted at least 1,2-positions or 1,4-positions of the benzene is more preferred. It is also possible to use these curing development agents in combination. Moreover, a reducing agent which is used in the conventionally known photographic developing solution such as 3-pyrazolidones including 1-phenyl-3-pyrazolidone, 1-p-tolyl-3-pyrazolidone, 1-phenyl-4-methyl-3-pyrazolidone, 1-phenyl-4,4-dimethyl-3-pyrazolidone and 1-p-chlorophenyl-3-pyrazolidone, etc., can be used in combination with the above-mentioned curing development agent.

These curing development agents may be contained in either of the layers of the precursor of the conductive material, and it is preferred to be contained in the silver halide emulsion layer or the subbing layer, more preferably in the silver halide emulsion layer. A preferred amount thereof to be contained is varied depending on an amount of the water-soluble binder to be used since it is an amount capable of making the water-soluble binder in the silver halide emulsion layer water-resistant. A preferred amount of the curing development agent is 0.01 to 0.5 mmol/1 g of the water-soluble binder, more preferably 0.1 to 0.4 mmol/1 g of the water-soluble binder. These curing development agents may be dissolved in a coating solution or contained in the respective layers, or it is possible to be contained in the respective layers by dissolving in an oil dispersion.

In the precursor for the conductive material of Type 3, a swelling inhibitor is preferably contained. The swelling inhibitor in the present invention means an agent which is to prevent the water-soluble binder from swelling at the time of treating the precursor for the conductive material with a curing-development solution, and to be used for preventing from blur of an image and increasing transparency, and increasing conductivity. Whether a material acts as a swelling inhibitor or not can be examined by adding a swelling inhibitor to a 5% aqueous gelatin solution with a pH of 3.5 in an amount of 0.35 mol/L and to check whether a precipitation of gelatin occurs or not. All the chemicals which cause precipitation of gelatin in this test act as a swelling inhibitor. Specific examples of the swelling inhibitor may be mentioned, for example, inorganic salts such as sodium sulfate, lithium sulfate, calcium sulfate, magnesium sulfate, sodium nitrate, calcium nitrate, magnesium nitrate, zinc nitrate, magnesium chloride, sodium chloride, manganese chloride, magnesium phosphate, etc., or sulfonic acids, for example, benzene-sulfonic acid, diphenylsulfonic acid, 5-sulfosalicylic acid, p-toluenesulfonic acid, phenol disulfonic acid, α-naphthalenesulfonic acid, β-naphthalenesulfonic acid, 1,5-naphthalenesulfonic acid, 1-hydroxy-3,6-naphthalene disulfonic acid, dinaphthylmethanesulfonic acid, etc., and a compound to be used as a polymer precipitating agent, for example, polyvinylbenzenesulfonic acid, a copolymerized product of maleic anhydride and vinylsulfonic acid, polyvinylacrylamide, etc., and the like. These swelling inhibitors may be used alone or in combination, and inorganic salts, particularly sulfates are preferably used. These swelling inhibitors may be contained in any layers of the precursor for the conductive material, and more preferably contained in the silver halide emulsion layer. A preferred content of these swelling inhibitors is 0.01 to 10 $g/m^2$, more preferably 0.1 to 2 $g/m^2$.

It is also possible to further contain, in the pre-cursor for the conductive material of Type 3, an electro-less plating catalyst or a conductive substance, etc.

To make the precursor for the conductive material of the above-mentioned Type 3 a conductive material, a method of preparing a pattern portion containing silver may be mentioned, for example, a formation of a silver thin film having a mesh-like pattern, and this can be exposed by the method explained in the above-mentioned Type 1 or Type 2.

In Type 3, curing development is carried out after exposing the precursor for the conductive material. In the curing-development solution, there may be contained an additive, for example, an alkaline substance such as potassium hydroxide, sodium hydroxide, lithium hydroxide, sodium tertiary phosphate and amine compound, a thickening agent such as carboxylmethyl cellulose, a developing aid such as 3-pyrazolidinones, an antifoggant such as potassium bromide, a development modifier such as a polyoxyalkylene compound, a silver halide solvent such as thiosulfate, thiocyanates, cyclic imide, thiosalicylic acid, mesoionic compound, etc. A pH of the developing solution is usually 10 to 14. A preservative such as sodium sulfite, etc., which is used in the usual silver salt photographic developing solution has a function of stopping a curing reaction by the curing development, so that in the curing-development solution of the present invention, the preservative is used in an amount of 20 g/L or less, preferably an amount of 10 g/L or less.

In the curing-development solution of Type 3, when a curing development agent is to be not contained in the precursor for the conductive material, a curing development agent is to be contained. As the curing development agent, a similar curing development agent to be contained in the precursor for the conductive material can be used. A preferred content of the curing development agent is 1 to 50 g/L. When the curing development agent is contained in the developing solution, it has poor reservability and immediately oxidized by air, so that it is preferably dissolved in an aqueous alkalin solution immediately before the use.

In the curing-development solution of Type 3, a swelling inhibitor is preferably contained. As the swelling inhibitor, a similar swelling inhibitor to be contained in the precursor for the conductive material can be used. A preferred content of the swelling inhibitor is 50 to 300 g/L, more preferably 100 to 250 g/L.

As a method of effecting the curing development of Type 3, it may be either a dipping system or a coating system. The dipping system is to convey the precursor for the conductive material, for example, in a treating solution stored in a tank with a large amount while dipping, and the coating system is to coat a treating solution, for example, on the precursor for the conductive material in an amount of 40 to 120 ml or so per 1 $m^2$. When the curing-development solution containing a curing development agent is to be used, the coating system is employed, and it is preferred to not repeatedly use the curing-development solution.

Curing development conditions of Type 3 are preferably a development temperature of 2 to 30° C., more preferably 10 to 25° C. A development time is preferably 5 to 30 seconds, more preferably 5 to 10 seconds.

In the steps of Type 3, a step of removing the silver halide emulsion layer at the light-transmitted portion to expose the support surface is contained. The main object of this step is to remove the silver halide emulsion, so that the treating solution used in this step comprises water as a main component. The treating solution may contain a buffer component. Also, for the purpose of preventing the removed gelatin from decomposition, an antiseptic agent may be contained. As a method of removing the silver halide emulsion, there is a method of scrubbing with a sponge, etc., a method of peeling by contacting a roller to the film surface and slipping the roller, a method of contacting a roller to the film surface and the film is adhered to the roller, etc. As a method of hitting a treating solution flow to the surface of the silver halide emulsion, a shower system, a slit system, etc., may be used alone or in combination. Also, it is possible to heighten efficiency of removal by providing a plural number of showers or slits.

In Type 3, after preparing a relief image by removing the silver halide emulsion layer at the non-image portion, more firm relief image can be prepared by treating it with a solution containing a conventionally known film-hardening agent for those skilled in the art. As the film-hardening agent, there may be used various kinds of materials such as chromium alum, aldehydes such as formaldehyde, etc., ketones such as diacetyl, etc., mucochloric acids, etc.

In Type 3, after the curing development, the precursor for the conductive material is treated with a physical development solution containing a silver halide solvent to enhance the silver in the relief image cured by the curing development whereby conductivity can be heightened. The physical development step may be carried out either before or after removal of the silver halide emulsion layer, but silver halide at the light-transmitted portion can be used as a supplying source of silver so that the physical development step is preferably carried our before removal. Also, by supplying silver ions additionally, e.g., a silver salt is added to the physical development solution, etc., silver can be enlarged by the physical development step.

As the reducing agent to be used in the physical development solution, conventionally known developing agents in the field of photographic development can be used. There may be mentioned, for example, polyhydroxy-benzenes such as hydroquinone, catechol, pyrogallol, methylhydroquinone, chlorohydroquinone, etc., ascorbic acid and its derivatives, 3-pyrazolidones such as 1-phenyl-4,4-dimethyl-3-pyrazolidone, 1-phenyl-3-pyrazolidone, 1-phenyl-4-methyl-4-hydroxymethyl-3-pyrazolidone, etc., paramethylaminophenol, paraminophenol, parahydroxyphenylglycine, paraphenylenediamine, etc. These reducing agents may be used alone, or in combination of plural kinds.

A pH of the physical development solution is preferably 8 or higher, more preferably 9 to 11. To adjust the pH at the desired range, alkali agents such as sodium hydroxide, potassium hydroxide, etc., and buffers such as phosphoric acid, carbonic acid, etc., are contained alone or in combination. Also, in the physical development solution of the present invention, preservatives such as sodium sulfite or potassium sulfite, etc., are preferably contained.

To the physical development solution, a bromide such as potassium bromide, sodium bromide, etc. is preferably added. When the development is carried out in the presence of a suitable amount of the bromide, conductivity of the obtained metal silver becomes good. Preferred bromide concentration is $1\times10^{-4}$ mol/L or more and $1\times10^{-2}$ mol/L or less.

A potassium ion concentration in the physical development solution is preferably 70 mol % or more based on the total alkali metal ion in the physical development solution. By making the potassium ion concentration 70 mol % or more, even in the state of physically developing the precursor with a certain extent, conductivity of the obtainable metal silver is relatively good. The potassium ions may be supplied in any forms and methods. There may be mentioned, for example, a method of provisionally adding the ions as a salt of hydroxide, sulfite, carbonate, carboxylate, etc. to the physical development solution.

The physical development solution contains a soluble silver complex salt forming agent. The soluble silver complex salt-forming agent is a compound which dissolves a non-light-sensitive silver salt to form a soluble silver complex salt. As the soluble silver complex salt-forming agent to be used in the physical development solution, there may be mentioned thiosulfates such as sodium thio-sulfate and ammonium thio-sulfate, thiocyanates such as sodium thiocyanate and ammonium thiocyanate, sulfites such as sodium sulfite and potassium hydrogen sulfite, oxazolidones, 2-mercaptobenzoic acid and its derivatives) cyclic imides such as uracil, alkanolamine, diamine, mesoionic compounds disclosed in JP 9-171257A, thioethers disclosed in U.S. Pat. Nos. 5,200,294, 5,5-dialkylhydantoins, alkyl sulfones, and other compounds as disclosed in "The Theory of the photographic Process ($4^{th}$ edition, p474 to 475)", written by T. H. James.

Of these soluble silver complex salt-forming agents, an alkanolamine is more preferred. Surface resistance of a conductive material subjected to development with a treating solution containing an alkanolamine gives a relatively low value.

As the alkanolamine, there may be mentioned, for example, N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N-ethyl-2,2'-imino-diethanol, 2-methylaminoethanol, 2-amino-2-methyl-1-propanol, etc.

These soluble silver complex salt-forming agents may be used alone, or in combination of plural kinds. A content of the soluble silver complex salt-forming agent is preferably 0.001 to 5 mol per liter of the treating solution, more preferably in the range of 0.005 to 1 mol. A content of the reducing agent is preferably 0.01 to 1 mol per liter of the treating solution, more preferably in the range of 0.05 to 1 mol.

In Type 3, it is possible that the physical development solution further contains a silver ion. A preferred content of the silver ion is 0.01 to 1 mol/L, more preferably 0.02 to 0.5 mol/L. In place of containing the silver ion in the physical development solution, a silver halide emulsion having low sensitivity may be contained in the precursor for the conductive material. The silver halide emulsion having low sensitivity means a silver halide emulsion having 70% or less of the sensitivity of the silver halide emulsion (hereinafter abbreviated to as a high-sensitivity emulsion) used in the precursor for the conductive material. The low-sensitivity silver halide emulsion (hereinafter abbreviated to as a low-sensitivity emulsion) is preferably contained in terms of silver in an amount of 0.5 to 5 g/m$^2$, more preferably 1 to 3 g/m$^2$ in the precursor for the conductive material. A ratio of the high-sensitivity silver emulsion and the low-sensitivity emulsion is not required to be particularly restricted, and a preferred range is the high-sensitivity emulsion:the low-sensitivity emulsion=1:10 to 2:1, more preferably 1:5 to 1:1 in terms of silver.

In Type 3, a method of carrying the physical development may be a dipping system or a coating system. The dipping system is to convey the precursor for the conductive material, for example, in a treating solution stored in a tank with a large amount while dipping, and the coating system is to coat a treating solution, for example, on the precursor for the conductive material in an amount of 40 to 120 ml or so per 1 m$^2$.

As preferred physical development conditions to improve conductivity and metal glossiness of the pattern portion containing silver, a development temperature is 2 to 25° C., more preferably 10 to 20° C. A development time is 30 to 180 seconds, more preferably 40 to 120 seconds.

In the conductive materials obtained by using the pattern portion containing silver prepared by any of the methods of Type 1, Type 2 or Type 3, for various kinds of purposes such as to obtain higher conductivity, or changing color tone of the silver image, etc., it is possible to further carry out a plating treatment to the conductive pattern obtained by subjecting to a treatment with a post-treatment solution containing a water-soluble halogen compound, etc. As the plating treatment, there may be used electroless plating (chemical reduction plating or substituted plating), electrolytic plating, or both of electroless plating and electrolytic plating. How much conductivity is provided by the plating treatment may vary depending on the uses of the resulting material. For example, for using it as an electromagnetic wave shielding material of a plasma display panel, it is required to provide a surface resistance value of 2.5Ω/☐ or less, preferably 1.5Ω/☐ or less.

When an electroless plating treatment is applied, an activation treatment may be carried out in a solution containing palladium for the purpose of promoting electro-less plating. As the palladium, it may be a divalent palladium salt or in the form of a complex salt thereof, or may be metal palladium. However, in view of stability of a liquid, and stability of the treatment, a palladium salt or its complex salt is preferably used.

For the electroless plating, conventionally known electroless plating technique, for example, electroless nickel plating, electroless cobalt plating, electroless gold plating, electroless silver plating, electroless copper plating, etc., can be used, and for the purpose of obtaining the above-mentioned necessary conductivity and transparency, electroless copper plating is preferably carried out.

The electroless copper plating solution contains a copper supplying source such as copper sulfate and copper chloride, etc., a reducing agent such as formaldehyde, glyoxylic acid, potassium tetrahydroborate and borane dimethylamine, etc., a complexing agent of copper such as EDTA, diethylenetriamine pentaacetic acid, Rochelle salt, glycerol, meso-erythritol, adonitol, D-mannitol, D-sorbitol, dulcitol, iminodiacetic acid, trans-1,2-cyclohexane-diamine-4-acetic acid, 1,3-diaminopropane-2-ol tetraacetic acid, glycol ether diamine, triisopropanolamine, triethanolamine, etc., a pH adjusting agent such as sodium hydroxide, potassium hydroxide, lithium hydroxide, etc. Moreover, as the other additives for stabilizing the bath or improving smoothness of the plating film, polyethylene glycol, yellow prussiate of potash, bipyridyl, o-phenanthroline, neocuproine, thiourea, cyanide, etc., may be contained. The plating solution is preferably carried out aeration for increasing stability.

In the electroless copper plating, various kinds of complexing agents can be used as mentioned above. It has been known that copper oxide is coprecipitated depending on the kind of a complexing agent to maredly influence on conductivity, or it is difficult to prepare a stable plating solution or a plating supplementary solution, etc., since copper is easily precipitated in a complexing agent having a low complex stabilization constant with a copper ion such as triethanolamine, etc. Accordingly, an industrially and usually employable complexing agent is limited, and in the present invention, it is important to select a complexing agent as a composition of the plating liquor according to the similar reason. As the preferred complexing agent, there may be mentioned EDTA or diethylenetriamine pentaacetic acid, etc., having a large stabilization constant of a copper complex, and as the plating liquor using such a preferred complexing agent, there is, for example, a high temperature type electroless copper plating to be used for the preparation of a printing substrate. With regard to the manner of the high temperature type electroless copper plating, it has described in detail on p. 105 of "Electroless Plating, Foundation and Application" (Edited by Electric Plating Research Association), etc. In high temperature type plating, it is usually treated at 60 to 70° C., and a treatment time may vary whether electrolytic plating is carried out after electroless plating or not, and electroless plating treatment is usually carried out for 1 to 30 minutes, preferably 3 to 20 minutes, whereby the object of the present invention can be accomplished.

When the electroless plating treatment other than copper is to be carried out, for example, a method described on pp. 406 to 432 of "Plating Technique Guide Book" (Edited by Tokyo Plating Material Cooperative Association, Technical Committee, 1987), etc., can be used.

As the electrolytic plating method, conventionally known plating methods such as copper plating, nickel plating, zinc plating, tin plating, etc., can be used, and as the method, there may be used a method described in, for example, "Plating Technique Guide Book" (Edited by Tokyo Plating Material Cooperative Association, Technical Committee, 1987). Which plating method is used may vary depending on the use of the conductive material to be prepared, and when plating is carried out to further heighten conductivity, copper plating or nickel plating is preferred. As the copper plating method, a copper sulfate bath plating method or a copper pyrophosphate bath plating method is preferred, and as the nickel plating method, Watts bath plating method or black plating method, etc., is preferred.

After the plating treatment and the fixing treatment, it is possible to carry out an oxidation treatment. When a fixing treatment is carried out after the plating treatment, and the material is not treated with a bleach-fixing solution, the oxidation treatment is more preferably carried out. As the oxidation treatment, a conventionally known method using various kinds of oxidizing agents can be used. In the oxidation treating solution, as an oxidizing agent, there may be used various kinds of aminopolycarboxylic acid iron salts such as EDTA iron salt, DTPA iron salt, 1,3-PDTA iron salt, β-ADA iron salt, BAIDA iron salt, etc., bichromate, persulfate, permanganate, red prussiate of potash, etc., and it is preferred to use the aminopolycarboxylic acid iron salts which has a less load to environment and is safety. An amount of the oxidizing agent to be used is 0.01 to 1 mol/L, preferably 0.1 to 0.3 mol/L. And others, conventionally known materials such as a bromide, iodide, guanidines, quinones, aminoethanethiols, thiazoles, disulfides, heterocyclic mercaptos, etc., may be used as a promoter.

Next, the second embodiment of the present invention is explained.

At a pattern portion containing silver formed by applying a metal colloid solution containing ultra fine silver particles as a metal colloid to a support, and vaporizing a dispersing medium contained in the metal colloid solution, a number of the ultra fine silver particles contained therein is in a state wherein they are separated by a dispersant, or they have an extremely slight contact with each other so that its conductivity is none or extremely low. When any of (I) a reducing substance, (II) a water-soluble phosphorus oxo acid compound, (III) a water soluble halogen compound, or (IV) warm water of 55° C. or higher is acted on the pattern, there can be observed a phenomenon that can be estimated to be growth of said ultra fine silver particles and formation of connection with each other accompanied thereby, so that conductivity appears. The growth of the ultra fine silver particles reaches several-fold to several tens-fold in the particle size, and when conductivity is good, no clear particles can be observed and it reaches to a bulk metal state having slight spaces. Appearance of the conductivity occurs within several seconds with high conductivity in some cases, while it occurs extremely slowly, for example, for several ten days with high conductivity in other cases.

The metal colloid solution containing ultra fine silver particles as metal colloid in the present invention generally means a dispersion in which ultra fine silver particles having an average primary particle size of 200 nm or less are dispersed in a dispersing medium comprising water and/or an organic solvent. A preferred content of the ultra fine silver particles contained in the metal colloid solution is from 1% by weight to 95% by weight based on the total weight of the metal colloid solution, more preferably from 3% by weight to 90% by weight.

A dispersing medium of the ultra fine silver particles comprises water and/or an organic solvent, and there may be mentioned a constitution comprising water alone, a mixture of water and an organic solvent, and an organic solvent alone. As the organic solvent to be used, there may be mentioned alcohols such as methanol, ethanol, 1-propanol, 2-propanol, t-butyl alcohol, glycerin, dipropylene glycol, ethylene glycol, diethylene glycol, polyethylene glycol, hexanol, heptanol, octanol, decanol, cyclohexanol, terpineol, etc., ketones such as acetone, methyl ethyl ketone, methyl isobutyl ketone, diacetone-alcohol, etc., cellosolves such as methyl cellosolve, ethyl cellosolve, butyl cellosolve, etc., glycol ethers such as ethylene glycol monomethyl ether, ethylene glycol monoethyl ether, diethylene glycol monomethyl ether, diethylene glycol monoethyl ether, diethylene glycol dimethyl ether, diethylene glycol diethyl ether, triethylene glycol monobutyl ether, dipropylene glycol monoethyl ether, tripropylene glycol monomethyl ether, etc., glycol ether esters such as ethylene glycol monomethyl ether acetate, propylene glycol monomethyl ether acetate, cellosolve acetate, butoxycarbitol acetate, etc., amides such as 2-pyrrolidone, N-methylpyrrolidone, etc., long-chain alkanes such as hexane, heptane, octane, decane, tridecane, tetradecane, trimethylpentane, etc., cyclic alkanes such as cyclohexane, cycloheptane, cyclooctane, etc., aromatic hydrocarbons such as benzene, toluene, xylene, trimethyl-benzene, dodecylbenzene, etc., and the like. The organic solvent can use either one of the above alone, or two or more kinds may be used in admixture. Also, petroleum distillates, for example, a fraction (a mixture of an aromatic hydrocarbon and an aliphatic hydrocarbon) at 150 to 190° C. which has been known as mineral spirit may be used. As a preferred example, as a dispersing medium suitable for an ink-jet system, there may be mentioned, for example, a mixture of water and glycerin, ethylene glycol, diethylene glycol or 2-pyrrolidone, or a sole use of tetradecane or mineral spirit, etc. As a dispersing medium suitable for a spin coating system, there may be mentioned acetone, toluene, etc., and as a dispersing medium suitable for a screen printing system, there may be mentioned terpineol, ethylene glycol monomethyl ether acetate, cyclohexanone, etc. Also, it can be mentioned as one of the preferred embodiments that an organic solvent which swells or dissolves an undercoating layer mentioned below is used in combination with the above-mentioned solvents.

As the ultra fine silver particles, preferably used are those prepared by the conventionally known various kinds of methods such as an evaporation method in gas in which a metal is evaporated in an inert gas and recovers the same by cooling and condensation due to collision with the gas, a metal vapor synthesis method in which a metal is evaporated in vacuum and recovers the same with an organic solvent, a laser abrasion method in which evaporation and condensation are carried out in a liquid by an energy of laser irradiation whereby recovering the material, a chemically reducing method in which metal ions in a solution are reduced in an aqueous solution whereby forming and recovering the same, a method by thermal decomposition at an organometallic compound, a method by reduction of a metal chloride in a vapor phase, a method by reduction of an oxide in hydrogen, etc.

A particle size of the ultra fine silver particles is preferably 200 nm or less in view of stability of the colloid solution, more preferably 100 nm or less, particularly preferably 50 nm or less. Here, the particle size means an average particle size of the ultra fine silver particles observed by a transmission electron microscope (TEM) or scanning electron microscope (SEM).

As the metal ultra fine particles contained in the metal colloid solution, 50% by weight or more is silver, preferably 70% by weight or more. As a metal preferably contained other than silver, there may be mentioned gold, copper, platinum, palladium, rhodium, ruthenium, iridium, osmium, nickel and bismuth, and, in particular, for controlling migration specifically occurred in silver, gold, copper, platinum or palladium is preferred. As a method for adding a metal other than silver, there may be mentioned that, for example, the ultra fine silver particles may contain palladium therein as disclosed in JP 2000-090737A, or it may be a mixture of the ultra fine silver particles and the palladium ultra fine particles separately prepared as disclosed in JP 2001-35255 A. Also, as in silver nano particle ink available from Cima Nano Tech Co., metal colloid containing copper may be exemplified.

The ultra fine silver particles are preferably coated by a dispersant to form a stable metal colloid solution. For example, in the method disclosed in American Journal of Science, Vol. 37, P476-491, 1889, M Carey Lea., citric acid is used as a dispersant, and in the method disclosed in Experiments in Colloid Chemistry, 1940, p. 19, Hauser, E. A. and Lynn, J. E., dextrin is used as a dispersant. As others, there may be used various kinds of ionic compounds such as disodium malate, disodium tartarate and sodium glycolate, etc.; various kinds of surfactants such as sodium dodecylbenzene sulfonate, sodium oleate, polyoxyethylene alkyl ether and perfluoroalkyl ethyleneoxide adduct, etc., water-soluble polymers such as polyvinyl alcohol, polyvinylpyrrolidone, polyethylene glycol, gelatin, carrageenan, Gum Arabic, albumin, polyethyleneimine, carboxylmethyl cellulose and hydroxylpropyl celluloses, etc., various kinds of organic metal compounds having an aliphatic acid or an amine, etc., and the like. A content of these dispersants is preferably 40% by weight or less, more preferably 30% by weight or less based on the weight of the ultra fine silver particles contained in the metal colloid solution.

To the metal colloid solution, there may be added various kinds of additives such as a thickening agent, an antistatic agent, a UV absorber, a plasticizer, a polymer binder, etc., depending on the purposes, and, for example, by adding a UV curing resin component, a characteristic (UV curing characteristic) suitable for pattern formation according to UV printing or UV ink-jet system can be provided.

As the metal colloid solution, it can be adjusted in an optional form from a solution state with a low viscosity to a paste state with a high viscosity. More specifically, viscosity, surface tension, a size and a content of the ultra fine silver particles, etc., suitable for a device for forming the pattern portion containing silver are adjusted. For example, when gravure printing or ink-jet system is employed, it is preferred to adjust the viscosity in the range of 1 to 100 mPa·s, and when relief printing or screen printing is employed, it is preferred to adjust the viscosity in the range of 10 to 500 Pa·s.

When it is adjusted to a paste state with a high viscosity, it is difficult to obtain a desired viscosity only by making a concentration of the ultra fine silver particles high, so that it is preferred to contain as a polymer binder, for example, a cellulose resin, phenol resin, epoxy resin, acrylic resin, polyester resin, polyimide resin, etc.

As the metal colloid solution, colloid, ink or a paste containing conventionally known or commercially available ultra fine silver particles may be widely used.

Either of the reducing substance, water-soluble phosphorus oxo acid compound or water-soluble halogen compound to be used in the second embodiment of the present invention is preferably used those which are used in the first embodiment. Of these, in the second embodiment, citric acid, citric acidalkali metal salt, ascorbic acid, ascorbic acidalkali metal salt, phosphinic acid, phosphinic acidalkali metal salt, thiourea dioxide, hydrazinium sulfate, hydrogenated borons, an alkali metal salt of hydroquinone monosulfonate, sodium chloride, potassium chloride, calcium chloride, ammonium chloride, etc., are more preferred. A method of acting them on the pattern portion containing silver formed by applying the metal colloid solution onto a support is not particularly limited, and a post-treatment solution may be acted on the formed pattern portion containing silver, or they may be previously contained in the support in the same manner as in the first embodiment.

An amount of these compounds to be used may be optionally adjusted depending on a particle size of the ultra fine silver particles contained in the metal colloid solution to be used, a kind of the support, a method of addition, a rate of appearance of conductivity, conductivity to be aimed, etc. For example, when the water-soluble halogen compound is to be previously contained in the support, a molar number of the halogen to be contained is preferably 0.1 mol % to 500 mol % or so based on the molar number of the ultra fine silver particles, more preferably 1 mol % to 200 mol %, particularly preferably 5 mol % to 100 mol %.

In the present invention, in order to show conductivity at the pattern portion containing silver, it is necessary to act either of the reducing substance, water-soluble phosphorus oxo acid compound, water-soluble halogen compound or warm water of 55° C. or higher on the portion containing solidified ultra fine silver particles. However, even when a reducing substance, water-soluble phosphorus oxo acid compound, water-soluble halogen compound, etc., are contained in the metal colloid solution, conductivity of the portion containing ultra fine silver particles prepared by the metal colloid solution is none or extremely low. That is, when the chemically reducing method in which metal ions are reduced in an aqueous solution whereby forming and recovering particles is employed as a preparation method of the metal ultra fine particles, there are some cases in which the metal colloid solution contains a reducing substance, and, for example, when a metal colloid which uses dextrin as a dispersant and reducing agent is used, the dextrin which is a reducing agent is adsorbed on the surfaces of the ultra fine silver particles. However, a pattern portion containing silver is formed only by the metal colloid solution, conductivity at the portion containing the ultra fine silver particles is none or extremely low. Also, if dextrin is further added to the metal colloid solution, then, it can be observed a phenomenon that conductivity is lost. This can be considered that a space between the ultra fine silver particles becomes wide due to the existence of the added dextrin so that contact of the ultra fine silver particles with each other is reduced.

Also, in the case of a metal colloid solution using ultra fine silver particles prepared by a method other than the chemically reducing method, or in the case of a metal colloid solution which is prepared by the chemically reducing method but using a material other than the reducing agent itself as a dispersant, and further removing ions including the reducing agent to heighten stability of the metal colloid solution by centrifugation or ultrafiltration, etc., no reducing substance is contained in the metal colloid solution. Even when a reducing substance, water-soluble phosphorus oxo acid compound, water-soluble halogen compound, etc., is added to the above, only stability of the metal colloid solution is lowered, and no conductivity can be observed at the portion containing the ultra fine silver particles solidified therefrom. Accordingly, the effects of the invention can be firstly obtained by removing a dispersing medium from the pattern portion containing silver, and acting either of the reducing substance, water-soluble phosphorus oxo acid compound, water-soluble halogen compound, or warm water of 55° C. or higher on the portion containing the solidified ultra fine silver particles.

As the material of the support, there may be mentioned polyolefin series resins such as polyethylene-poly-propylene, etc., vinyl chloride series resins such as polyvinyl chloride-vinyl chloride copolymer, etc., epoxy resin, polyallylate, polysulfone, polyethersulfone, polyimide, fluorine resin, phenoxy resin, triacetate, polyethylene terephthalate, polyimide, polyphenylene sulfide, polyethylene naphthalate, acrylic resins such as polycarbonate-polymethyl methacrylate, etc., various kinds of resins such as cellophane, Nylon, styrene series resin, ABS resin, etc., various kinds of glasses such as quartz glass, alkaliless glass, crystallized transparent glass, Pyrex® glass, sapphire, etc., inorganic materials such as AlN, Al$_2$O$_3$, SiC, SiN, MgO, BeO, ZrO$_2$, Y$_2$O$_3$, ThO$_2$, CaO, GGG (gadolinium•gallium•garnet), monocrystalline silicon, polycrystalline silicon, etc., paper, various kinds of metals, etc., and they may be used in combination, if necessary. By optionally selecting from these materials depending on the uses, it can be made a flexible support such as a film state, etc., or a support having rigidity. Incidentally, a shape of the above-mentioned support may be an either shape such as a disc shape, card state, sheet state, etc. Also, it may be, for example, an electric terminal part such as a lead wire or bump, etc., of electronic parts, etc., and all the portions which are required to have conductivity such as a laminated capacitor or tantalum capacitor, a connecting portion of thin film resistance, TFT electrode, collection electrode of solar battery, gate electrode of organic FET, etc., can be a support of the present invention. Also, depending on the uses, these supports can be optionally combined, and, for example, there may be used a flexible print substrate material in which a copper foil and polyimide are laminated, or a polyolefin resin-coated paper in which paper and a polyolefin resin are laminated. Also, preferably used are, for example, a green sheet for a substrate prepared by casting a mixed slurry of alumina powder and a binder, or a green sheet for a laminated ceramic capacitor prepared by casting a mixed slurry of barium titanate powder and a binder, etc.

When high conductivity is not required between the support and the conductive pattern, a support in which an undercoating layer is provided on a substrate may be used for the purpose of improving adhesive force between the support and the conductive pattern, etc. The undercoating layer is generally insulative so that conductivity between the support and the conductive pattern is lowered. As a material for the undercoating layer, there may be mentioned, for example, polymer substances such as gelatin, carrageenan, acrylic acid•methacrylic acid copolymer, styrene•maleic anhydride copolymer, various kinds of urethane resins, polyvinyl alcohol, polyvinyl acetal polyvinylpyrrolidone, carboxylmethyl cellulose, hydroxyl-propyl cellulose, alcohol-soluble Nylon, N-methylol acrylamide, polyvinylidene chloride, vinyl acetate•vinyl chloride copolymer, ethylene•vinyl acetate copolymer, etc., thermosetting or photo•electron beam curing resin, surface modifiers such as a silane coupling agent, titanate type coupling agent, germanium series coupling agent, aluminum series coupling agent, imidazolesilane series coupling agent, etc., and they may be used singly or in combination of two or more kinds.

When the above-mentioned water-soluble resin such as gelatin, polyvinyl alcohol, polyvinyl acetal, polyvinylpyrrolidone, carrageenan, carboxylmethyl cellulose, hydroxylpropyl cellulose, etc., is used in the undercoating layer, it is preferred to use a suitable film-hardening agent for the purpose of improving water-resistance and film-hardened. As the film-hardening agent, there may be mentioned aldehyde series compounds such as formaldehyde and glutaraldehyde, ketone compounds such as diacetyl and chloropentanedione, bis(2-chloroethylurea)-2-hydroxy-4,6-dichloro-1,3,5 triazine, N-methylol compound, isocyanates, aziridine compounds, carbodiimide series compounds, epoxy compound, halogen carboxyaldehydes such as mucochloric acid, dioxane derivatives such as dihydroxydioxane, inorganic film-hardening agents such as chromium alum, zirconium sulfate, boric acid and borate, etc., and they can be used singly or two or more kinds in combination.

At the step of acting either of (I) a reducing substance, (II) a water-soluble phosphorus oxo acid compound, (III) a water-soluble halogen compound or (IV) warm water of 55° C. or higher on the ultra fine silver particles, a density of the ultra fine silver particles for forming a conductive pattern is preferably high. Also, it is one of the more preferred embodiments to have the undercoating layer a function of absorbing the dispersing medium in the metal colloid solution to prevent from spreading of the metal colloid solution by wetting and to make formation of the fine conductivity pattern easy. For example, when water is used as a dispersing medium of the metal colloid solution, each one or more of various kinds of water-soluble resins such as gelatin, carrageenan, polyvinyl alcohol, polyvinyl acetal, polyvinylpyrrolidone, carboxylmethyl cellulose, hydroxylethyl cellulose, etc., and a film-hardening agent to provide water-resistance can be used in optionally combination in the undercoating layer. Also, when an organic solvent is used as a dispersing medium of the metal colloid solution, a cellulose resin, polyvinylbutyral resin, acrylic resin, acrylic ester resin, amorphous polyester resin, etc., can be used in the undercoating layer. A preferred layer thickness (at the time of drying) of the undercoating layer is generally 0.01 to 50 μm, more preferably 1 to 40 μm, particularly preferably 5 to 30 μm.

Also, it is more preferred to absorb the dispersing medium in the metal colloid solution by using capillary phenomenon due to fine voids of a porous layer in addition to the absorption of the same by swelling or dissolution of the above-mentioned resin. In general, it is more prefer-red to use the porous layer than in the case of swelling of the resin since an absorption rate of the dispersing medium is rapid and absorption of the dispersing medium tends to be done irrespective of a kind thereof.

The undercoating layer due to a porous layer comprises fine particles and a resin binder, and as the fine particles to be used, conventionally known fine particles can be widely used. There may be mentioned, for example, inorganic fine particles such as light calcium carbonate, heavy calcium carbonate, magnesium carbonate, kaolin, talc, calcium sulfate, barium sulfate, titanium dioxide, zirconia, cerium, antimony oxide, zinc oxide, zinc sulfide, zinc carbonate, satin white, aluminum silicate, diatomaceous earth, calcium silicate, magnesium silicate, amorphous synthetic silica, colloidal silica, alumina, colloidal alumina, alumina hydrate, lithopone, zeolite, hydrated halloysite, magnesium hydroxide, etc, spherical or amorphous, non-porous or porous organic fine particles comprising at least one or more resins such as acrylic or methacrylic series resin, vinyl chloride series resin, vinyl acetate series resin, polyester series resin, styrene/acrylic series resin, styrene/butadieneseries resin, polystyrene/acrylic series resin, polystyrene/isoprene series resin, methyl methacrylate/butylmethacrylate series resin, polycarbonate series resin, silicone series resin, urea resin, melamine series resin, epoxy series resin, phenol series resin, diallylphthalate series resin, etc. Of course, one or more kinds of the above-mentioned inorganic fine particles and one or more kinds of the organic fine particles may be used in admixture.

Also, in the above-mentioned fine particles, there may be preferably used inorganic fine particles having an average secondary particle size of 500 nm or less such as amorphous synthetic silica, alumina, alumina hydrate, etc., or organic fine particles having an average particle size of 200 nm or less. When these inorganic fine particles are used, a porous layer having a high void ratio can be formed, refractive index becomes low due to high void ratio and surface reflectance can be reduced. For example, it is easy to make a glossiness value regulated by JIS-Z-8741 of 25 (which shows it has a reflectance of ¼ as compared with a standard glass) or less.

The amorphous synthetic silica can be roughly classified into fumed silica, wet process silica and others according to the preparation processes thereof. The wet process silica can be further classified into a precipitated silica, a gel method silica and a sol method silica according to the preparation process. The precipitated silica can be prepared by reacting sodium silicate and sulfuric acid under alkali conditions. Silica particles grown in particle size aggregated and precipitated, and then, they are processed through filtration, washing, drying, pulverization and classification to obtain a product. As the precipitated silica, it is commercially available, for example, from Toso Silica Corporation as Nipsil, K.K. Tokuyama as Tokusil, Mizusawa Industrial Chemicals, Ltd. as Mizukasil. The gel method silica can be produced by reacting sodium silicate and sulfuric acid under acidic conditions. Fine silica particles are dissolved during ripening and reprecipitated so that other primary particles are combined to each other. Thus, clear primary particles disappear and form relatively hard agglomerated particles having inner void structure. For example, it is commercially available from Toso Silica Corporation as Nipgel, Grace Japan Co., Ltd. as Cyroid or Cyrojet, Mizusawa Industrial Chemicals, Ltd. as Mizukasil. The sol method silica is also called to as colloidal silica and can be obtained by heating and ripening silica sol obtained by methathesis of sodium silicate by an acid or passing through an ion-exchange resin layer, and is commercially available, for example, from Nissan Chemical Industries, Ltd. as SNOWTEX.

Fumed silica is also called to as the drying method silica as compared to the wet process one, and it can be generally prepared by a flame hydrolysis method. More specifically, it has generally been known a method in which silicon tetrachloride is burned with hydrogen and oxygen, and a silane such as methyl trichlorosilane or trichlorosilane may be used in place of silicon tetrachloride singly or in combination with silicon tetrachloride. The fumed silica is commercially available from Nippon Aerosil K.K. as Aerosil, and K.K. Tokuyama as QS type, etc.

An average primary particle size of the fumed silica to be used is preferably 30 nm or less, and higher transparency is required, it is preferably 15 nm or less. Further preferred is to use a material having an average primary particle size of 3 to 15 nm and a specific surface area by the BET method of 200 $m^2/g$ or more (preferably 250 to 500 $m^2/g$). Incidentally, the average primary particle size referred to in the present invention means an average particle size of fine particles using 100 primary particles existing in a predetermined surface area and diameters of the circles thereof equivalent to the projected surface area of the respective primary particles according to electron microscopic observation as a particle diameter. The BET method mentioned in the present invention means one of a method for measuring surface area of powder material by a gas phase adsorption method and is a method of obtaining a total surface area possessed by 1 g of a sample, i.e., a specific surface area, from an adsorption isotherm. In general, as an adsorption gas, a nitrogen gas has frequently been used, and a method of measuring an adsorption amount obtained by the change in pressure or a volume of a gas to be adsorbed has most frequently been used. Most famous equation for representing isotherm of polymolecular adsorption is a Brunauer, Emmett, Teller equation which is also called to as a BET equation and has widely been used for determining a surface area of a substance to be examined. A surface area can be obtained by measuring an adsorption amount based on the BET equation and multiplying the amount with a surface area occupied by the surface of one adsorbed molecule.

For dispersing fumed silica, various kinds of conventionally known method can be employed, and there may be preferably employed, for example, either of a method of dispersion in the presence of an alkaline compound as disclosed in JP 2002-144701A, a method of dispersion using a mechanical shear force alone without using a dispersant, or a method of dispersion in the presence of a cationic compound, etc.

Also, dispersion in the presence of a silane coupling agent can be preferably carried out. A silane coupling agent having a quaternary ammonium group such as octadecyl-dimethyl [3-(trimethoxysilyl)propyl]ammonium chloride, N-β-(N-vinylbenzylaminoethyl)-γ-aminopropyltrimethoxysilane-hydrochloride, 3-(trimethoxysilyl)propyldimethylhydroxyethylammonium chloride, etc., are more preferably used.

An average secondary particle size of the dispersed fumed silica is 500 nm or less, preferably 10 to 300 nm, further preferably 20 to 200 nm. As the dispersing method, it is preferably carried out by provisionally mixing fumed silica and a dispersing medium mainly comprising water with a usual propeller stirring, turbine type stirring, homomixer type stirring, etc., then, dispersing the same with a media mill such as ball mill, beads mill, sand grinder, etc., a pressure type dispersing machine such as high pressure homogenizer, ultra high pressure homogenizer, etc., a ultrasonic wave dispersing machine, and a thin film pivoted type dispersing machine, etc. Incidentally, the average secondary particle size referred to in the present invention can be obtained by photographing using a transmission type electron microscope, and as a simple and easy method, it can be measured as a number median diameter by using a laser scattering particle size distribution analyzer (for example, manufactured by HORIBA Ltd., LA910).

In the present invention, wet process silica pulverized to have an average secondary particle size of 500 nm or less can be preferably used. As the wet process silica to be used, precipitated silica or gel method silica is preferred, and precipitated silica is more preferred. As the wet process silica particles to be used in the present invention, wet process silica particles having an average primary particle size of 50 nm or less, preferably 3 to 40 nm, and an average agglomerated particle size of 5 to 50 µm are more preferred.

As a pulverization method, a wet dispersing method in which silica dispersed in an aqueous medium is mechanically pulverized is preferably used. At this time, it is preferred to use precipitated silica having an average agglomerated particle size of 5 µm or more since increase in initial viscosity of the dispersion is controlled, dispersion with a high concentration is possible, and it can be pulverized to provide finer particles due to increase in pulverization and dispersion efficiencies. By using a dispersion with a high concentration, productivity is also improved.

For dispersing wet process silica, various kinds of conventionally known method can be used, and there may be preferably employed, for example, either of a method of dispersion in the presence of an alkaline compound as disclosed in JP 2005-1117A, a method of dispersion using a mechanical shear force alone without using a dispersant, or a method of dispersion in the presence of a cationic compound, a method of using a silane coupling agent, etc.

An average secondary particle size of the dispersed wet process silica is 500 nm or less, preferably 10 to 300 nm, and more preferably 20 to 200 nm in the point of transparency. As the dispersing method, silica particles and a cationic compound are mixed in a dispersing medium mainly comprising water, to obtain a provisional dispersion by using at least one dispersing machine such as a saw blade type dispersing device, propeller blade type dispersing machine, or rotor stator type dispersing machine, etc. If necessary, a suitable low-boiling point solvent, etc., may be added to the aqueous dispersing medium. A concentration of the solid content of the silica provisional dispersion is preferably higher, but it becomes too higher concentration, dispersing operation becomes impossible so that a preferred range is 15 to 40% by weight, more preferably 20 to 35% by weight. Next, silica provisional dispersion is applied to a mechanical means having stronger shear force to pulverize silica particles, whereby a wet process silica fine particle dispersion having an average secondary particle size of 500 nm or less can be obtained. As the mechanical means, conventionally known methods can be employed, and there may be used, for example, media mills such as a ball mill, beads mill, sand grinder, etc., pressure type dispersing machines such as a high pressure homogenizer, ultra high pressure homogenizer, etc., ultrasonic wave dispersing machines and thin film pivoted type dispersing machines, etc.

As the cationic compound to be used for dispersing the above-mentioned fumed silica and wet process silica, a cationic polymer can be preferably used. As the cationic polymer, there may be preferably used a polyethyleneimine, polydiallylamine, polyallylamine, alkyl amine polymerized product, a polymer having a primary to tertiary amino group or a quaternary ammonium base as disclosed in JP 59-20696A, JP 59-33176A, JP 59-33177A, JP 59-155088A, JP 60-11389A, JP 60-49990A, JP 60-83882A, JP 60-109894A, JP 62-198493A, JP 63-49478A, JP 63-115780A, JP 63-280681A, JP 1-40371A, JP 6-234268A, JP 7-125411A, JP 10-193776A, etc. As the cationic polymer, diallylamine derivatives are more preferably used. A weight average molecular weight of these cationic polymers is preferably 2,000 to 100,000 or so, more preferably 2,000 to 30,000 or so in the points of dispersibility and a viscosity of the dispersion.

As the alumina, γ-alumina which is a γ type crystal line of aluminum oxide is preferred, and of these, δ group crystalline is more preferred. The γ-alumina is possible to make the primary particle size as small as 10 nm or so, and generally, secondary particle crystalline having several thousands to several ten-thousands nm is pulverized by ultrasonic wave or a high pressure homogenizer, a counter-collision type jet pulverizer, etc., to have an average secondary particle size of 500 nm or less, more preferably 20 to 300 nm or so.

The alumina hydrate is represented by the structural formula of $Al_2O_3 \cdot nH_2O$ (n=1 to 3), and can be obtained by the conventionally known preparation methods such as hydrolysis of aluminum alkoxides such as aluminum isopropoxide, etc., neutralization of aluminum salts by an alkali, hydrolysis of aluminates, etc. An average secondary particle size of the alumina hydrate is 500 nm or less, more preferably 20 to 300 nm.

The above-mentioned alumina and alumina hydrate are used in the form of a dispersion which is dispersed by a conventionally known dispersant such as acetic acid, lactic acid, formic acid, nitric acid, etc.

As the resin binder to be used with inorganic fine particles which constitute the undercoating layer as a porous layer, there may be mentioned, for example, polyvinyl alcohol, silanol-modified polyvinyl alcohol, polyvinyl acetate, oxidized starch, etherified starch, cellulose derivatives such as carboxylmethyl cellulose, hydroxyethyl cellulose, etc., casein, gelatin, acidic gelatin, soybean protein, silyl-modified polyvinyl alcohol, etc.; conjugated diene series copolymer latexes such as maleic anhydride resin, styrene-butadiene copolymer, methyl methacrylate-butadienecopolymer, etc.; acrylic series polymer latexes such as a polymer or copolymer of an acrylate and methacrylate, a polymer or copolymer acrylic acid and methacrylic acid, etc.; vinyl series polymer latexes such as ethylene vinyl acetate copolymer, etc.; or functional group-modified polymer latexes by a monomer containing a functional group such as a carboxyl group, etc., of these various kinds of polymers; aqueous adhesives such as thermosetting synthetic resin series, etc., including melamine resin, urea resin, etc.; synthetic resin series adhesives such as polymethyl methacrylate, poly-urethane resin, unsaturated polyester resin, vinyl chloride-vinyl acetate copolymer, polyvinylbutyral, alkyd resin, etc., and they can be used singly or in admixture. As others, it is not particularly limited to use a conventionally known natural or synthetic resin binder singly or in admixture.

Among the polyvinyl alcohols, more preferred is that of a partially or completely saponified product having a saponification degree of 80% or more. Those having an average polymerization degree of 200 to 5000 are preferred.

A content of the resin binder to these inorganic fine particles or organic fine particles is not particularly limited, and for forming a porous layer by using inorganic fine particles, the content of the resin binder is preferably in the range of 3 to 80% by weight based on the inorganic fine particles, more preferably in the range of 5 to 60% by weight, particularly preferably in the range of 10 to 40% by weight. In the organic fine particles, it is also possible to form a porous layer by adhesion of organic fine particles with each other, so that there is no under limit of the content of the resin binder, and it is preferably in the range of 0 to 80% by weight, more preferably in the range of 0 to 60% by weight, particularly preferably in the range of 0 to 40% by weight.

In the present invention, a film-hardening agent can be used depending on necessity with the above-mentioned resin binder constituting the undercoating layer as a porous layer. Specific examples of the film-hardening agent may be mentioned aldehyde series compounds such as formaldehyde and glutaraldehyde, ketone compounds such as diacetyl and chloropentanedione, bis(2-chloroethylurea)-2-hydroxy-4,6-dichloro-1,3,5-triazine, compounds having a reactive halogen as disclosed in U.S. Pat. No. 3,288,775, divinylsulfone, compounds having a reactive olefin as disclosed in U.S. Pat. No. 3,635,718, N-methylol compounds as disclosed in U.S. Pat. No. 2,732,316, isocyanates as disclosed in U.S. Pat. No. 3,103,437, aziridine compounds as disclosed in U.S. Pat. No. 3,017,280 and No. 2,983,611, carbodiimide series compounds as disclosed in U.S. Pat. No. 3,100,704, epoxy compounds as disclosed in U.S. Pat. No. 3,091,537, halogen carboxyaldehydes such as mucochloric acid, dioxane derivatives such as dihydroxy-dioxane, inorganic cross-linking agents such as chromium alum, zirconium sulfate, borax, boric acid, borates, etc., and they can be used singly or two or more kinds in combination. An amount of the film-hardening agent is not specifically limited, and it is preferably 50% by weight or less based on the amount of the resin binder, more preferably 40% by weight or less, particularly preferably 30% by weight or less.

When a partially or completely saponified polyvinyl alcohol having a saponification degree of 80% or more is used as a hydrophilic binder, the film-hardening agent is preferably borax, boric acid or borates, more preferably boric acid, and an amount to be used is preferably 40% by weight or less based on the amount of the polyvinyl alcohol, more preferably 30% by weight or less, particularly preferably 20% by weight or less.

Also, a resin binder having a keto group may be used as a hydrophilic binder constituting the undercoating layer as a porous layer. The resin binder having a keto group can be synthesized by a method of copolymerizing a monomer having a keto group and other monomer, etc. Specific examples of the monomer having a keto group may be mentioned acrolein, diacetone acrylamide, diacetone methacrylate, acetacetoxyethyl methacrylate, 4-vinylacetanilide, acetacetylallylamide, etc. Also, the keto group may be introduced by a polymer reaction, and, for example, an acetacetyl group can be introduced by a reaction of a hydroxyl group or an amino group with a diketene, etc. Specific examples of the resin binder having a keto group may be mentioned acetacetyl-modified polyvinyl alcohols, acetacetyl-modified cellulose derivatives, acetacetyl-modified starches, diacetoneacrylamide-modified polyvinyl alcohols, resin binders disclosed in JP 10-157283A, etc. In the present invention, a modified polyvinyl alcohol having a keto group is more preferred. As the modified polyvinyl alcohol having a keto group, there may be mentioned acetacetyl-modified polyvinyl alcohols, diacetoneacrylamide-modified polyvinyl alcohols, etc.

The acetacetyl-modified polyvinyl alcohol can be produced by a conventionally known method such as a reaction of polyvinyl alcohol and a diketene, etc. An acetacetylation degree is preferably 0.1 to 20 mol %, more preferably 1 to 15 mol %. A saponification degree is preferably 80 mol % or more, more preferably 85 mol % or more. A polymerization degree is preferably 500 to 5000, more preferably 2000 to 4500.

The diacetoneacrylamide-modified polyvinyl alcohol can be produced by a conventionally known method such as saponifying a diacetoneacrylamide-vinyl acetate copolymer, etc. A content of the diacetoneacrylamide unit is preferably in the range of 0.1 to 15 mol %, more preferably in the range of 0.5 to 10 mol %. A saponification degree is preferably 85 mol % or more, and a polymerization degree is preferably 500 to 5000.

In the present invention, the resin binder having a keto group contained in the undercoating layer as a porous layer is preferably cross-linked by a cross-linking agent. Such a cross-linking agent is preferably a polyhydrazide compound and a polyvalent metal salt. Among the polyhydrazide compounds, a dihydrazide compound is preferred, and adipic acid dihydrazide and succinic acid dihydrazide are particularly preferred. As the polyvalent metal salt, a zirconium salt is more preferred, and zirconium oxychloride and zirconium nitrate are particularly preferred.

In the present invention, as the resin binder contained in the undercoating layer as a porous layer, it is preferred to use a resin which cures by UV ray or electron beam. In particular, when the porous layer is partially formed on the support, the porous layer can be fixed or solidified by irradiating UV ray or electron beam immediately after the coating, so that it is preferred.

As the UV ray-curing resin to be used in the present invention, a compound having an ethylenically unsaturated bond may be mentioned, and more specifically, the following compounds may be mentioned.

(a) Poly(meth)acrylate of an aliphatic, alicyclic, aromatic or aromatic-aliphatic polyvalent alcohol and polyalkylene glycol (b) Poly(meth)acrylate of polyvalent alcohol in which an alkylene oxide is added to an aliphatic, alicyclic, aromatic or aromatic-aliphatic polyvalent alcohol (c) Polyester poly(meth)acrylate (d) Polyurethane poly(meth)acrylate (e) Epoxy poly(meth)acrylate (f) Polyamide poly(meth)acrylate (g) A poly(methacryloyloxyalkyl phosphoric acid ester (h) A vinyl series or diene series compound having a (meth)acryloyloxy group at the side chain or at the terminal thereof (i) A mono-functional (meth)acrylate, vinylpyrrolidone, (meth)acryloyl compound (k) A cyano compound having an ethylenically unsaturated bond (l) A mono or polycarboxylic acid having an ethylenically unsaturated bond, and their alkali metal salt, ammonium salt, amine salt, etc.

(m) An ethylenically unsaturated (meth)acrylamide or alkyl substituted (meth)acrylamide and a polymer thereof (n) A vinyl lactam and polyvinyl lactam compound (o) A polyether having an ethylenically unsaturated bond and an ester thereof (p) An ester of an alcohol having an ethylenically unsaturated bond (q) A polyalcohol having an ethylenically unsaturated bond and an ester thereof (r) An aromatic compound having one or more ethylenically unsaturated bonds such as styrene, divinylbenzene, etc.

(s) A polyorganosiloxane series compound having a (meth)-acryloyloxy group at the side chain or at the terminal thereof (t) A silicone compound having an ethylenically unsaturated bond (u) A polymer or oligo ester (meth)acrylate-modified product of the compounds described in the above-mentioned (a) to (t).

These resins can be used alone, or may be used in admixture with the other resin(s). Also, they can be coated without solvent, may be coated by diluting with a solvent, or may be used by coating with an emulsion state, drying and curing. Of these, the urethane acrylate series resin shown by the above-mentioned (d) is suitable in the present invention since drying shrinkage is small due to relatively large molecular weight and less possibility of causing warpage of the support, etc.

In the present invention, in order to obtain affinity with inorganic fine particles dispersed and pulverized in water, a water-soluble UV-curing resin is preferably used. In recent years, aqueous type materials without containing any solvent are commercially available from manufacturers considering working environments. For example, Beam Set series materials are commercially available from Arakawa Chemical Industries, Ltd., and NK Oligo Series materials are commercially available from Shin-Nakamura Chemical Co., Ltd., etc.

As a photopolymerization initiator to be used in the UV-curing resin, there are mentioned acetophenones such as di- and tri-chloroacetophenone, benzophenone, Michiler's ketone, benzyl, benzoin, benzoin alkyl ether, benzyl dimethylketal, tetramethyl thiuram monosulfide, thioxanthones, azo compounds, various kinds of silver salts, etc. An amount of the photopolymerization initiator to be used is generally in the range of 0.1 to 10% by weight with a concentration of a solid content based on the amount of the UV-curing resin. Also, a storage stabilizer such as hydro-quinone may sometimes be used in the photopolymerization initiator.

Also, the UV-curing resin can be cured by irradiation of electron beam. As an electron beam accelerator, there may be any of the devices, for example, electro-curtain system, scanning type, double scanning type, etc. Or else, an ultra-small sized electron beam irradiating device which is practically used in recent years, for example, having a silicon foil with a size of 3 μm or so as a window, and can take out an electron beam with a relatively low energy, for example, an acceleration voltage of 100 KV or less, for example, a device commercially available from American International Technology Enterprises, Inc., as Min-EB can be extremely preferably used in the viewpoint of not causing any damage by the electron beam to the portions other than the porous layer-formed portion.

A content of these resin binders cured by UV rays or electron beam is preferably in the range of 5 to 80% by weight based on the amount of the fine particles, more preferably in the range of 10 to 60% by weight.

A layer thickness of the porous layer (at the time of drying) is generally preferably 1 to 100 μm, more preferably 5 to 70 μm, particularly preferably 10 to 50 μm.

To the undercoating layer may be added depending on necessity an antiseptic agent, surfactant, coloring dye, UV absorber, antioxidant, dispersant of pigment, defoaming agent, leveling agent, viscosity stabilizer, pH adjusting agent, etc.

The undercoating layer may be constituted by two or more layers, and in this case, the constitutions of these undercoating layers may be the same or different from each other, and, for example, an undercoating layer which is a porous layer may be formed under (a side nearer to the substrate) an undercoating layer comprising a resin.

The undercoating layer can be formed by utilizing various kinds of conventionally known coating methods such as dissolving or dispersing one or more kinds of the above-mentioned materials in a suitable solvent to prepare a coating solution, coating said coating solution by a curtain system, extrusion system, slot die system, gravure roller system, spray system, air knife system, blade coating system, rob bar coating system, spin coating system, etc., and forming a pattern by a relief printing, flexographic printing, gravure printing, screen printing, ink-jet system, etc., on a whole surface of the substrate, or subjecting to selective coating to a necessary portion.

In the present invention, when either of the reducing substance, water-soluble phosphorus oxo acid compound or water-soluble halogen compound is contained in the undercoating layer, these substances may be formulated in the coating solution for the undercoating layer, or after forming the undercoating layer, dipping by using a dip method, etc., by using a solution containing these or coating with the above-mentioned various kinds of coating devices may be carried out.

Also, to improve adhesiveness between the support and the conductive pattern, a direct corona treatment, plasma treatment, etc., may be carried out to the support, and after forming the above-mentioned undercoating layer, these treatments may be carried out.

As a method to form a pattern portion containing silver on a support, it is coated by a desired shape by the various kinds of methods conventionally known in the art, for example, filling to a concave portion•formation of a convex portion•formation of a pattern by a dispenser, filling to a concave portion•formation of a convex portion•formation of a pattern by an ink-jet system having a mechanism which jets liquid drops by thermal or piezo, micro pump, static electricity, etc., formation of a pattern by a relief printing, flexographic printing, lithographic printing, intaglio printing, gravure printing or screen printing, formation of a coating layer by a gravure roller system, slot die system, spin coating system, etc., formation of a partial coating layer by a intermittent coating die coater, etc. Also, to obtain a desired thickness, the coating may be divided in a plural number of times and can be carried out.

As a step of acting either of the reducing substance, water-soluble phosphorus oxo acid compound or water-soluble halogen compound on the ultra fine silver particles of the pattern portion containing silver, other than applying the treatment of applying a treatment using a post-treatment solution shown in the first embodiment of the present invention, there may be shown, for example, the following methods. Also, for acting warm water of 55° C. or higher onto the material, a method of applying the treatment using a post-treatment solution is used.

1. A method in which these substances themselves or a layer containing the same is/are previously formed on a whole surface or a necessary portion of a support, and a desired pattern shape is formed thereon by using a metal colloid solution.

2. A method in which a desired pattern shape is formed on a support by using a metal colloid solution, then, a solution containing these substances is coated (for example, according to an ink-jet system or dispenser system, etc.) thereon or dipping.

3. A method in which a desired pattern shape is formed on a support by using a metal colloid solution, then, the material is allowed to stand in a circumstance where a solution in which these substances are dissolved or dispersed being present in a mist state.

4. A method in which a metal colloid solution and a solution containing these substances are mixed immediately before providing on a support, and a desired pattern is formed on the support by using the same.

5. A method in which ultra fine silver particles and these substances are both dispersed in a non-polar organic solvent containing no water, a desired pattern is formed on a support by using the same, and the organic solvent is evaporated or absorbed.

To heighten conductivity of the conductive material formed by the methods of 1 to 5, it is preferred to further supply water, For supplying water, there are methods, for example, providing water drops by an ink-jet system or subjecting to spray of mist water by a spray nozzle, and a method by humidity can be also preferably used.

Water can be present with a larger amount on a surface of the support by, for example, lowering a support temperature than a circumferential temperature. It may be dewed, and more preferably a state of not dewed. It may be simply heighten a humidity of a circumferential atmosphere without carrying out temperature control of a surface of the support. In this case, a temperature is preferably from 10° C. to 80° C., and a weight absolute humidity H is preferably 0.01 kg/kg D.A. or higher.

After forming the conductive pattern, it is preferred to remove either of the reducing substance, water-soluble phosphorus oxo acid compound or water-soluble halogen compound by washing. Also, it is preferably carried out to coat (for example, according to an ink-jet system or dispenser system, etc.) a coating solution containing a resin components) (for example, components to be used in the above-mentioned undercoating layer) for encapsulating a conductive pattern on a whole surface or necessary portion of the support on which a conductive pattern has been formed, whereby protecting the prepared conductive pattern.

In the following, the present invention is explained in detail by referring to Examples, but the contents of the present invention are not limited by Examples.

Example 1

Examples of the first embodiment of the present invention are shown below. To prepare a precursor for the conductive material, a polyethylene terephthalate film with a thickness of 100 μm having a layer containing poly(vinylidene chloride) was used as a transparent support. Before coating a physical development nuclei layer, a base layer with a gelatin dry weight of 50 mg/m² was coated on the film and dried. Next, a physical development nuclei layer coating solution containing palladium sulfide was prepared in the following manner.

<Preparation of Palladium Sulfide Sol>

| Solution A | |
|---|---|
| Palladium chloride | 5 g |
| Hydrochloric acid | 40 ml |
| Distilled water | 1000 ml |
| Solution B | |
| Sodium sulfide | 8.6 g |
| Distilled water | 1000 ml |

Solution A and Solution B were mixed under stirring, and after 30 minutes, the mixture was passed through a column filled with an ion exchange resin to obtain palladium sulfide sol.

<Preparation of Physical Development Nuclei Layer Coating Solution>

| The above-mentioned palladium sulfide sol | 50 ml |
|---|---|
| 2% by weight glutaraldehyde solution | 20 ml |
| Surfactant (S-1) | 1 g | water was added to make up the total amount 2000 ml. This physical development nuclei layer coating solution was coated on the base layer so that the palladium sulfide became 0.4 mg/m² as a solid content, and dried to form a physical development nuclei layer.

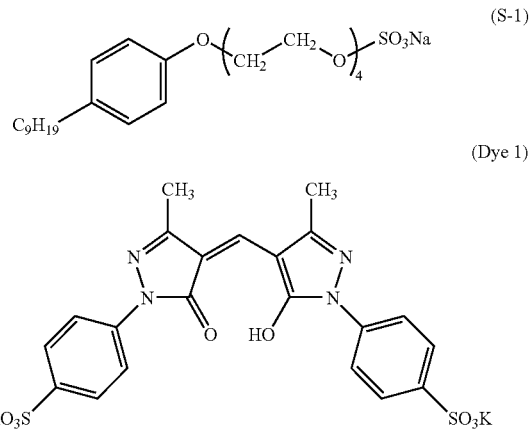

Subsequently, on the opposite side to the side on which the above-mentioned physical development nuclei layer had been coated was coated a back-coating layer with the following mentioned composition.

<Back-Coating Layer Composition/Per 1 m²>

| Gelatin | 2 g |
|---|---|
| Amorphous silica matte agent (average particle size: 5 μm) | 20 mg |
| Dye 1 | 200 mg |
| Surfactant (S-1) | 400 mg |

Subsequently, an intermediate layer 1, a silver halide emulsion layer 1 and an outermost layer 1 with the following mentioned compositions were coated on the above-mentioned physical development nuclei layer in this order from the side nearer to the support. The silver halide emulsion was prepared by a double jet mixing method which is general in a silver halide emulsion for photography. This silver halide emulsion was so prepared that 95 mol % of silver chloride and 5 mol % of silver bromide, and an average particle size became 0.15 μm. To the thus obtained silver halide emulsion was applied a gold-sulfur sensitization using sodium thiosulfate and chloroauric acid according to the conventional manner. The thus obtained silver halide emulsion contains 0.5 g of gelatin per 1 g of silver.

<Intermediate Layer 1 Composition/Per 1 m²>

| Gelatin | 0.5 g |
|---|---|
| Surfactant (S-1) | 5 mg |

<Silver Halide Emulsion Layer 1 Composition/Per 1 m²>

| Gelatin | 0.5 g |
|---|---|
| Silver halide emulsion | corresponding to 3.0 g of silver |
| 1-Phenyl-5-mercaptotetrazole | 3.0 mg |
| Surfactant (S-1) | 20 mg |

<Outermost Layer 1 Composition/Per 1 m²>

| Gelatin | 1 g |
|---|---|
| Amorphous silica matte agent (average particle size: 3.5 μm) | 10 mg |
| Surfactant (S-1) | 10 mg |

The thus obtained precursor for the conductive material was exposed by a contact printer using a mercury lamp as a light source through a resin filter which cuts light of 400 nm or shorter by contacting a transparent manuscript having a positive image with a mesh-pattern having a fine line width of 20 μm and a lattice distance of 250 μm. Also, as a sample for measuring X-ray diffraction, an unexposed sample was also prepared.

Subsequently, the following mentioned diffusion transfer developing solution 1 was prepared. Thereafter, the previously exposed precursor for the conductive material and the unexposed precursor for the conductive material were dipped in the following mentioned developing solution at 15° C. for 90 seconds, and the silver halide emulsion layer and the non-light-sensitive layer were removed by washing with warm water at 40° C., and then subjected to a drying treatment. From the exposed sample, a conductive material on which a silver thin film had been formed in a transparent mesh pattern state was obtained, while from the unexposed sample, a conductive material on which a silver thin film had been formed on the whole surface was obtained.

<Diffusion Transfer Developing Solution 1>

| Potassium hydroxide | 25 g |
|---|---|
| Hydroquinone | 18 g |
| 1-Phenyl-3-pyrazolidone | 2 g |
| Potassium sulfite | 80 g |
| N-methylethanolamine | 15 g |
| Potassium bromide | 1.2 g |

Water was added to make up the total amount 1000 ml and adjusted to pH=12.2.

The thus obtained conductive material on which a silver thin film had been formed in a mesh-pattern and the conductive material on which silver had been precipitated on the whole surface were subjected to dipping treatment with post-treatment solutions 1-1 to 1-14 shown in Table 1 at 60° C. for 90 seconds, then, washed with pure water at 20° C., and dried (2 minutes) with warm wind at 60° C. by using a film dryer to obtain conductive materials A1 to A14. Also, as a comparison, a comparative conductive material A-15 in which no dipping treatment with the post-treatment solution has been carried out but washing with pure water at 20° C. and drying with warm wind at 60° C. alone have been carried out, and a comparative conductive material A-16 in which neither of the post-treatment, nor washing and drying treatment has been carried out were prepared.

TABLE 1

| Post-treatment solution No. | Component of post-treatment solution | Concentration (wt %) | Remark 1 | Remark 2 |
|---|---|---|---|---|
| 1-1 | Ascorbic acid | 15 | Present invention | |
| 1-2 | Potassium hydroquinone monosulfate | 15 | Present invention | |
| 1-3 | Hydroxylamine | 15 | Present invention | |
| 1-4 | Pyrrogalol | 15 | Present invention | |
| 1-5 | Monosodium phosphate | 15 | Present invention | |
| 1-6 | Sodium hexa-metaphosphate | 15 | Present invention | |
| 1-7 | Dihydrogen disodium pyrophosphate | 15 | Present invention | |
| 1-8 | DDP8 | 15 | Present invention | Dipolyoxyethylene alkyl phosphate available from Nippon Surfactant Co. |
| 1-9 | Sodium chloride | 15 | Present invention | |
| 1-10 | Potassium chloride | 15 | Present invention | |
| 1-11 | Ammonium chloride | 15 | Present invention | |
| 1-12 | Sodium bromide | 15 | Present invention | |
| 1-13 | Potassium iodide | 15 | Present invention | |

TABLE 1-continued

| Post-treatment solution No. | Component of post-treatment solution | Concentration (wt %) | Remark 1 | Remark 2 |
|---|---|---|---|---|
| 1-14 | Unisence FPA100L | 15 | Present invention | Diallyl dimethyl ammonium chloride polymerized product available from Senka Co. |

Surface resistances of the thus obtained conductive materials on which mesh-pattern state silver thin film had been formed were measured by using Loresta GP/ESP probe manufactured by DIA INSTRUMENTS CO., LTD., according to JIS K 7194. The obtained results were summarized in Table 2.

Moreover, the conductive materials on which the mesh-pattern state silver thin film had been formed were placed in a temperature chamber at 60° C. for 1 week, and the surface resistance value thereafter was measured. The obtained results were also shown in Table 2 as a lowered value (%) of the surface resistance value after heating as compared with the surface resistance value before heating as 100%.

Also, a half-value width at 2θ=38.2° of the conductive material on which a silver thin film had been formed on the whole surface was measured by using an X-ray diffraction device MiniFlex manufactured by Rigaku Corporation. MiniFlex uses CuKα ray as a light source, and its output is 30 kV and 15 mA. As the measurement method, a step scanning method is employed, and a data sampling interval is 0.01°, and a measurement time of 1 data point is 1 second. The obtained half-value width at the peak of 2θ=38.2° is also shown in Table 2.

TABLE 2

| Conductive material No. | Post treatment solution No. | Surface resistance value (Ω/□) | Surface resistance value (%) after heating | Half-value width | Remarks |
|---|---|---|---|---|---|
| A-1 | 1-1 | 45 | 85 | 0.33 | Present invention |
| A-2 | 1-2 | 50 | 80 | 0.33 | Present invention |
| A-3 | 1-3 | 50 | 80 | 0.33 | Present invention |
| A-4 | 1-4 | 50 | 80 | 0.33 | Present invention |
| A-5 | 1-5 | 50 | 80 | 0.33 | Present invention |
| A-6 | 1-6 | 50 | 75 | 0.34 | Present invention |
| A-7 | 1-7 | 50 | 80 | 0.33 | Present invention |
| A-8 | 1-8 | 60 | 75 | 0.34 | Present invention |
| A-9 | 1-9 | 15 | 100 | 0.3 | Present invention |
| A-10 | 1-10 | 15 | 100 | 0.3 | Present invention |
| A-11 | 1-11 | 15 | 100 | 0.3 | Present invention |
| A-12 | 1-12 | 15 | 100 | 0.3 | Present invention |
| A-13 | 1-13 | 20 | 100 | 0.31 | Present invention |
| A-14 | 1-14 | 15 | 100 | 0.3 | Present invention |
| A-15 | None | 150 | 50 | 0.45 | Comparative |
| A-16 | None | 150 | 50 | 0.45 | Comparative |

From the results in Table 2, it can be understood that by treating a post-treatment solution containing a reducing substance, a water-soluble phosphorus oxo acid compound, a water-soluble halogen compound, in particular by a post-treatment solution containing a water-soluble halogen compound, the surface resistance value is markedly lowered, and fluctuation of the resistance value by the heating test thereafter becomes small. In comparative conductive materials A-15 and A-16, there is no difference in the surface resistance value, whereby it can be understood usefulness of the present invention in which the resistance value is markedly lowered by a short time treatment of 90 seconds.

Example 2

By using the post-treatment solution 1-9 of Example 1, the same test was carried out in the same manner as in Example 1 except for changing the treatment temperature and treatment time. As a result, the results shown in Table 3 were obtained.

TABLE 3

| Conductive material No. | Treatment temperature (° C.) | Treatment time (second) | Surface resistance value (Ω/□) | Half-value width | Surface resistance value (%) after heating | Remarks |
|---|---|---|---|---|---|---|
| B-1 | 30 | 90 | 50 | 0.33 | 80 | Present invention |
| B-2 | 40 | 90 | 30 | 0.32 | 90 | Present invention |
| B-3 | 50 | 90 | 30 | 0.31 | 100 | Present invention |
| B-4 | 60 | 10 | 30 | 0.32 | 90 | Present invention |

TABLE 3-continued

| Conductive material No. | Treatment temperature (° C.) | Treatment time (second) | Surface resistance value (Ω/□) | Half-value width | Surface resistance value (%) after heating | Remarks |
|---|---|---|---|---|---|---|
| B-5 | 60 | 30 | 20 | 0.31 | 100 | Present invention |
| B-6 | 60 | 60 | 15 | 0.3 | 100 | Present invention |
| B-7 | 60 | 90 | 15 | 0.3 | 100 | Present invention |
| A-15 | None | None | 150 | 0.45 | 50 | Comparative |

From Table 3, in the case of 60° C., it can be well understood the surprising effects of the present invention that the resistance value drops 1/5 of the original value with the post-treatment only for 10 seconds.

Example 3

In the same manner as in Example 1, a back-coating layer was coated onto a polyethylene terephthalate film.

Subsequently, on an opposite surface of the support on which a back-coating layer has been provided, a silver halide emulsion layer 2 was coated. The silver halide emulsion was prepared by a double jet mixing method which is general in a silver halide emulsion for photography. This silver halide emulsion was so prepared that 40 mol % of silver chloride and 60 mol % of silver bromide, and an average particle size became 0.15 μm. To the thus obtained silver halide emulsion was applied a gold-sulfur sensitization using sodium thiosulfate and chloroauric acid according to the conventional manner. The thus obtained silver halide emulsion contains 1 g of gelatin per 3 g of silver.

<Silver Halide Emulsion Layer 2 Composition/Per 1 m²>

| Gelatin | 1 g |
| Silver halide emulsion | corresponding to 3.0 g of silver |
| 1-Phenyl-5-mercaptotetrazole | 3.0 mg |
| Surfactant (S-1) | 20 mg |
| Glyoxal (40% by weight aqueous solution) | 50 mg |

The thus obtained precursor for the conductive material was exposed by a contact printer using a mercury lamp as a light source through a resin filter which cuts light of 400 nm or shorter by contacting a transparent manuscript having a negative image with a mesh-pattern having a fine line width of 20 μm and a lattice distance of 250 μm. Also, as a sample for measuring X-ray diffraction, a whole surface exposed sample was also prepared.

Subsequently, the material was dipped in a direct developing solution having the following mentioned prescription at 30° C. for 30 seconds, and then, it was dipped in a 2% by weight acetic acid solution at 20° C. for 30 seconds to carry out a stopping treatment.

<Direct Developing Solution>

| Sodium sulfite | 70 g/L |
| Hydroquinone | 18 g/L |
| 1-Phenyl-3-pyrazolidone | 0.7 g/L |
| Potassium carbonate | 30 g/L |

-continued

| Potassium bromide | 3 g/L |
| N-(2-aminoethyl)ethanolamine | 3 g/L |
| Sodium hydroxide | An amount to make pH = 10.5 |

The precursor for the conductive material finished for the development and the stopping treatment was dipped in the following mentioned fixing solution at 20° C. for 180 seconds.

<Fixing Solution>

| N-(2-aminoethyl)ethanolamine | 300 g |

It was adjusted with a 5N aqueous sodium hydroxide solution so that a pH became 10.5, and water was further added to make the whole amount 1 L.

The thus obtained conductive material on which a mesh-pattern state silver thin film had been formed, and the conductive material on the whole surface of which had been formed a silver thin film were treated by the post-treatment solutions 1-1 to 1-14 used in Example 1 in the same manner as in Example 1 to obtain conductive materials C-1 to C-14 and a comparative conductive material C-15 which had not been carried out the treatment by the post-treatment solution. They were evaluated in the same manner as in Example 1, and the results shown in Table 4 were obtained.

TABLE 4

| Conductive material No. | Post treatment solution No. | Surface resistance value (Ω/□) | Surface resistance value (%) after heating | Half-value width | Remarks |
|---|---|---|---|---|---|
| C-1 | 1-1 | 160 | 65 | 0.36 | Present invention |
| C-2 | 1-2 | 190 | 60 | 0.38 | Present invention |
| C-3 | 1-3 | 190 | 60 | 0.38 | Present invention |
| C-4 | 1-4 | 190 | 60 | 0.38 | Present invention |
| C-5 | 1-5 | 190 | 60 | 0.38 | Present invention |
| C-6 | 1-6 | 220 | 55 | 0.4 | Present invention |
| C-7 | 1-7 | 190 | 60 | 0.38 | Present invention |
| C-8 | 1-8 | 220 | 55 | 0.4 | Present invention |
| C-9 | 1-9 | 70 | 75 | 0.34 | Present invention |

TABLE 4-continued

| Conductive material No. | Post treatment solution No. | Surface resistance value (Ω/□) | Surface resistance value (%) after heating | Half-value width | Remarks |
|---|---|---|---|---|---|
| C-10 | 1-10 | 70 | 75 | 0.34 | Present invention |
| C-11 | 1-11 | 70 | 75 | 0.34 | Present invention |
| C-12 | 1-12 | 90 | 70 | 0.35 | Present invention |
| C-13 | 1-13 | 70 | 75 | 0.34 | Present invention |
| C-14 | 1-14 | 90 | 70 | 0.35 | Present invention |
| C-15 | None | 340 | 35 | 0.46 | Comparative |

From Table 4, it can be understood that effects can be obtained by the post-treatment as in Example 1.

Example 4

To prepare a precursor for the conductive material, a polyethylene terephthalate film which is the same as used in Example 1 was used as a transparent support, and a back-coating layer with the following mentioned composition was coated on the support.

<Back-Coating Layer Composition/Per 1 m²>

| | |
|---|---|
| Gelatin | 2 g |
| Amorphous silica matte agent (average particle size: 5 μm) | 20 mg |
| Surfactant (S-1) | 400 mg |

Subsequently, on an opposite surface of the support on which a back-coating layer has been provided, a silver halide emulsion layer 3 was coated. The silver halide emulsion was prepared by a double jet mixing method which is general in a silver halide emulsion for photography. This silver halide emulsion was so prepared that 40 mol % of silver chloride and 60 mol % of silver bromide, and an average particle size became 0.15 μm. Also, by using a low molecular weight gelatin having a molecular weight of 10,000 or less as a part of the protective binder of the silver halide emulsion, the low molecular weight gelatin was to be removed at the time of removal by washing in the desalting treatment step after mixing. To the thus obtained silver halide emulsion was applied a gold-sulfur sensitization using sodium thiosulfate and chloroauric acid according to the conventional manner. The thus obtained silver halide emulsion contains 0.5 g of gelatin per 3 g of silver.

<Silver Halide Emulsion Layer Composition 3/Per 1 m²>

| | |
|---|---|
| Gelatin | 1.0 g |
| Silver halide emulsion | corresponding to 3.0 g silver |
| 1-Phenyl-5-mercaptotetrazole | 3.0 mg |
| Surfactant (S-1) | 20 mg |
| 4-Phenylcatechol | 20 mg |
| Sodium sulfate | 0.05 g |

The thus obtained precursor for the conductive material was exposed by contacting a transparent manuscript having a negative image in the same manner as in Example 3. Also, as a sample for measuring an X-ray diffraction, a sample in which whole surface had been exposed was also prepared.

Subsequently, the materials were subjected to dipping treatment with a curing-development solution having the following mentioned prescription at 23° C. for 30 seconds to carry out curing development, then, treated by the following mentioned diffusion transfer developing solution 2 at 25° C. for 40 seconds, and subjected to removal treatment by washing with warm water at 35° C.

<Curing Development Solution>

| | |
|---|---|
| Sodium hydroxide | 20 g |
| Potassium bromide | 1 g |
| Sodium sulfite | 1 g |

<Diffusion Transfer Developing Solution 2>

| | |
|---|---|
| Tripotassium phosphate | 25 g |
| Hydroquinone | 18 g |
| 1-Phenyl-3-pyrazolidine | 2 g |
| Potassium sulfite | 50 g |
| N-methylethanolamine | 10 g |
| Potassium bromide | 0.5 g |

Whole amount was made 1000 ml with water, and the solution was adjusted to pH=10.5 by adding phosphoric acid.

The obtained conductive materials were treated in the same manner as in Example 1 with the post-treatment solutions 1-1 to 1-14 used in Example 1 to obtain conductive materials D-1 to D-14 and comparative conductive material D-15 which had not been carried out the treatment with the post-treatment solution. They are evaluated in the same manner as in Example 1 to obtain the results shown in Table 5.

TABLE 5

| Conductive material No. | Post treatment solution No. | Surface resistance value (Ω/□) | Surface resistance value (%) after heating | Half-value width | Remarks |
|---|---|---|---|---|---|
| D-1 | 1-1 | 90 | 70 | 0.35 | Present invention |
| D-2 | 1-2 | 100 | 70 | 0.35 | Present invention |
| D-3 | 1-3 | 100 | 70 | 0.35 | Present invention |
| D-4 | 1-4 | 100 | 70 | 0.35 | Present invention |
| D-5 | 1-5 | 100 | 70 | 0.35 | Present invention |
| D-6 | 1-6 | 120 | 65 | 0.36 | Present invention |
| D-7 | 1-7 | 100 | 70 | 0.35 | Present invention |
| D-8 | 1-8 | 120 | 65 | 0.36 | Present invention |
| D-9 | 1-9 | 30 | 90 | 0.32 | Present invention |
| D-10 | 1-10 | 30 | 90 | 0.32 | Present invention |
| D-11 | 1-11 | 30 | 90 | 0.32 | Present invention |
| D-12 | 1-12 | 30 | 90 | 0.32 | Present invention |
| D-13 | 1-13 | 40 | 90 | 0.32 | Present invention |
| D-14 | 1-14 | 30 | 90 | 0.32 | Present invention |
| D-15 | None | 200 | 45 | 0.46 | Comparative |

From Table 5, it can be understood that the post-treatment of the present invention gives the effects even when the curing development system is used.

Example 5

By using warm pure water in place of the post-treatment solution of Example 1, and changing the treatment temperature and treatment time, tests were carried out in the same manner as in Example 1 other than the above. As a result, the results shown in Table 6 were obtained.

TABLE 6

| Treatment temperature (° C.) | Treatment time (second) | Surface resistance value (Ω/□) | Surface resistance value (%) after heating | Half-value width | Remarks |
|---|---|---|---|---|---|
| 30 | 90 | 150 | 50 | 0.45 | Comparative |
| 40 | 90 | 150 | 50 | 0.45 | Comparative |
| 50 | 90 | 145 | 50 | 0.44 | Comparative |
| 60 | 90 | 130 | 60 | 0.4 | Present invention |
| 60 | 180 | 110 | 65 | 0.39 | Present invention |
| 60 | 300 | 100 | 65 | 0.39 | Present invention |
| None | None | 150 | 50 | 0.45 | Comparative |

From Table 6, it can be understood that warm water is used as a post-treatment solution, the effects are not so remarkable as in Example 1, but the surface resistance value is lowered, and storage stability is improved. Also, it can be understood that no effect can be obtained at a liquid temperature of 50° C. or lower.

Example 6

A conductive material having a length of 500 mm and a width of 500 mm was prepared by making a fine line width of the mesh-pattern of Example 1 10 μm without the post-treatment in the same manner as in conductive material A-15 of Example 1. The obtained conductive material was subjected to dipping treatment with the post-treatment solution 1-9 of Example 1 at 60° C. for 90 seconds, and then subjected to washing treatment, and that which had not been subjected to post-treatment to prepare two kinds of materials. A surface resistance value of the material subjected to the post-treatment was 80Ω/□, and a surface resistance value of the material without the post-treatment was 1000Ω/□. With regard to these materials, nickel plating was carried out by using the following mentioned nickel plating solution at a temperature of 45° C. and a current density of 4 A/dm². In the sample subjected to the post-treatment, whole surface of the mesh-pattern can be plated uniformly, but in the sample without the post-treatment, only the portion to which electricity had been applied was plated.

<Prescription of Nickel Plating Solution>

| | |
|---|---|
| Nickel sulfate | 240 g/L |
| Nickel chloride | 45 g/L |
| Boric acid | 30 g/L | pH = 4.5

Example 7

The same tests were carried out as Example 2 except for carrying out the post-treatment before development. The conductive materials in which the post-treatment solutions 1-1 to 1-4, 1-8 and 1-14 had been used occurred on the whole surface of fogging significantly. In the conductive materials in which the post-treatment solutions 1-5 to 1-7, and 1-9 to 1-13 had been used, it could not be admitted any difference from the material in which no post-treatment has been carried out in the surface resistance value and the half-value width at the peak of 2θ=38.2°.

Example 8

A diffusion transfer developing solution 3 in which 50 g/L of sodium chloride has been added to the diffusion transfer developing solution of Example 1 was prepared. A sample which uses the precursor for the conductive material prepared in Example 1, and exposed in the same manner as in Example 1, and an unexposed sample were prepared. These samples were dipped in the prepared diffusion transfer developing solution 3 at 20° C. for 180 seconds, then, the silver halide emulsion layer and the non-light-sensitive layer were removed by washing with warm water at 40° C., and subjected to drying treatment to obtain conductive materials. However, the surface resistance values and the half-value widths at the peak of 2θ=38.2° of these conductive materials are equivalent to those of A-15 and 16 of Example 1. Thus, even when sodium chloride had been added to the developing solution, the surface resistance value of the conductive material was not lowered.

Example 9

By using the conductive material A-15 of Example 1, this was treated with the post-treatment solution 1-5 of Example 1 by changing the treatment temperature and the treatment time, subjected to washing and drying, then, it was evaluated in the same manner as in Example 1. The results are shown in Table 7. As can be seen from Table 7, it can be understood that good results can be obtained when the half value width at the peak of 2θ=38.2° becomes narrow.

TABLE 7

| Treatment temperature (° C.) | Treatment time (second) | Surface resistance value (Ω/□) | Surface resistance value (%) after heating | Half-value width | Remarks |
|---|---|---|---|---|---|
| 30 | 30 | 145 | 50 | 0.45 | Present invention |
| 40 | 30 | 140 | 50 | 0.42 | Present invention |
| 60 | 90 | 50 | 80 | 0.33 | Present invention |
| None | None | 150 | 50 | 0.45 | Comparative |

Example 10

By using the conductive material A-15 of Example 1, it was subjected to post-treatment using post-treatment solutions 1-15 to 1-23 shown in Table 8 at 40° C. for 90 seconds, and the results evaluated in the same manner as in Example 1 are shown in Table 9. Incidentally, in Table 9, OL means that the surface resistance value is larger than $10^6 Ω/□$, and impossible to carry out the measurement, From Table 9, it can be understood that even when the treatment is carried out by a post-treatment solution containing a component other than the water soluble phosphorus oxo acid compound or water-soluble halogen compound, the effects are not changed in the case of treating with pure water, or worsened.

TABLE 8

| Post-treatment solution No. | Component of Post-treatment solution | Concentration (% by weight) | Remarks |
| --- | --- | --- | --- |
| 1-15 | Monosodium phosphate | 15 | Present invention |
| 1-16 | Sodium Nitrate | 15 | Comparative |
| 1-17 | Sodium sulfate | 15 | Comparative |
| 1-18 | Sodium sulfite | 15 | Comparative |
| 1-19 | Boric acid | 2 | Comparative |
| 1-20 | Sodium chloride | 3 | Present invention |
| 1-21 | Sodium sulfide | 3 | Comparative |
| 1-22 | Sodium perchlorate | 3 | Comparative |
| 1-23 | Pure water | — | Comparative |

TABLE 9

| Conductive material No. | Post treatment solution No. | Surface resistance value ($\Omega/\square$) | Surface resistance value (%) after heating | Half-value width | Remarks |
| --- | --- | --- | --- | --- | --- |
| E-1 | 1-15 | 120 | 65 | 0.39 | Present invention |
| E-2 | 1-16 | 150 | 50 | 0.45 | Comparative |
| E-3 | 1-17 | 150 | 50 | 0.45 | Comparative |
| E-4 | 1-18 | 150 | 50 | 0.45 | Comparative |
| E-5 | 1-19 | 150 | 50 | 0.45 | Comparative |
| E-6 | 1-20 | 50 | 80 | 0.33 | Present invention |
| E-7 | 1-21 | OL | — | Impossible to measure | Comparative |
| E-8 | 1-22 | OL | — | Impossible to measure | Comparative |
| E-9 | 1-23 | 150 | 50 | 0.45 | Comparative |

Example 11

Examples of the second embodiment according to the present invention are shown below.
<Preparation of Aqueous Silver Colloid Solution 1>
An aqueous solution in which 3.5 g of dextrin had been dissolved in 31.5 g of deionized water, and an aqueous solution in which 8.5 g of silver nitrate had been dissolved in 41.5 g of deionized water were mixed, and 38 g of 2N aqueous sodium hydroxide solution was gradually added dropwise to the mixture over 1 minute under stirring. After 1 hour, stirring was stopped, and the mixture was allowed to stand for 12 hours. Thereafter, decantation was carried out, 25 g of deionized water was added to 25 g of the obtained precipitate to disperse again, and centrifugation was carried out to obtain solid precipitate. To the solid precipitate was added 7 g of deionized water, a silver colloid solution with a concentration of a solid content of 38% by weight and a specific gravity of 1.4 was obtained.

To the obtained silver colloid solution was added conc. nitric acid to make silver nitrate, and then, titration was carried out by using an aqueous potassium iodide solution to obtain a silver concentration. The obtained silver concentration was 32% by weight, and 6% by weight which corresponds to the difference from the concentration of the solid content of 38% by weight corresponds to the content other than silver such as the dispersant, etc. Also, as a result of observation by electron microscope, a particle size of the ultra fine silver particles was about 20 nm.

<Preparation of Aqueous Silver Colloid Solution 2>
An aqueous solution in which 43 g of ferrous sulfate heptahydrate had been dissolved in 100 g of deionized water, and an aqueous solution in which 66 g of sodium citrate dihydrate had been dissolved in 100 g of deionized water were mixed, and a pH thereof was adjusted to 6 with 5N aqueous sodium hydroxide solution. Under stirring, an aqueous solution in which 11 g of silver nitrate had been dissolved in 100 g of deionized water was gradually added to the mixture, to obtain an aqueous metal colloid solution containing ultra fine silver particles having iron citrate as a protective colloid. This aqueous metal colloid solution was allowed to stand overnight, decantation was carried out, and then, 300 g of 1N aqueous ammonium nitrate solution was added. Decantation was carried out three times to remove excess salts, and centrifugation was carried out to obtain solid precipitate. To this solid precipitate was added 5 g of deionized water to obtain a silver colloid solution with a concentration of a solid content of 55% by weight and a specific gravity of 1.7.

To the obtained silver colloid solution was added conc. nitric acid to make silver nitrate, and titration was carried out by using an aqueous potassium iodide solution to obtain a silver concentration. The obtained silver concentration was 45% by weight, and 10% by weight which corresponds to the difference from the concentration of the solid content of 55% by weight corresponds to the content other than silver such as the dispersant, etc. Also, as a result of observation by electron microscope, a particle size of the ultra fine silver particles was about 10 nm.

<Preparation of Aqueous Silver Colloid Solution 3>
An aqueous solution in which 43 g of ferrous sulfate heptahydrate had been dissolved in 100 g of deionized water, and an aqueous solution in which 66 g of sodium citrate dihydrate had been dissolved in 100 g of deionized water were mixed, and a pH thereof was adjusted to 6 with 5N aqueous sodium hydroxide solution. Under stirring, an aqueous solution in which 10.5 g of silver nitrate and 0.68 g of palladium nitrate had been dissolved in 100 g of deionized water was gradually added to the mixture to obtain an aqueous metal colloid solution containing silver palladium ultra fine particles having iron citrate as a protective colloid. This aqueous metal colloid solution was allowed to stand overnight, decantation was carried out, and then, 300 g of 1N aqueous ammonium nitrate solution was added. Decantation was carried out three times to remove excess salts, and centrifugation was carried out to obtain solid precipitate. To this solid precipitate was added 5 g of deionized water to obtain a silver colloid solution with a concentration of a solid content of 52% by weight and a specific gravity of 1.6.

To the obtained silver colloid solution was added conc. nitric acid to make silver nitrate, and titration was carried out by using an aqueous potassium iodide solution to obtain a silver concentration. The obtained silver concentration was 41% by weight. Further, when a concentration of palladium was measured by using a fluorescent X-ray analyzer (RIX1000 manufactured by Rigaku Corporation), a result of 2% by weight was obtained. The sum of the both is 43% by weight, and 9% by weight which corresponds to the difference from the concentration of the solid content of 52% by weight corresponds to the content other than silver and palladium such as the dispersant, etc. Also, as a result of observation by electron microscope, a particle size of the silver palladium ultra fine particles was about 10 nm.

<Preparation of Support 1>

As a water-soluble halogen compound, Polyfix 601 (available from SHOWA HIGHPOLYMER CO., LTD.) which is a polyamine resin having a chlorine ion as a counter ion was used, and it was coated on a polyethylene terephthalate film (available from Teijin DuPont Films Japan Limited) having a thickness of 100 μm and had been subjected to a treatment to heighten adhesiveness with the coated layer with a dry film thickness of 2 μm and dried.

<Preparation of Support 2>

By using PAS-H-1L (available from Nitto Boseki Co., Ltd.) which is a diallyldimethyl ammonium chloride-polymerized product having a chlorine ion as a counter ion, it was coated on a polyethylene terephthalate film (available from Teijin DuPont Films Japan Limited) having a thickness of 100 μm and had been subjected to a treatment to heighten adhesiveness with the coated layer with a dry film thick-ness of 2 μm and dried.

<Preparation of Support 3>

By using PAA HCL-3L (available from Nitto Boseki Co., Ltd.) which is a polyallylamine series polymer having a chlorine ion as a counter ion, it was coated on a poly ethylene terephthalate film (available from Teijin DuPont Films Japan Limited) having a thickness of 100 μm and had been subjected to a treatment to heighten adhesiveness with the coated layer with a dry film thickness of 2 μm and dried.

<Preparation of Support 4>

By using PAA-10C (available from Nitto Boseki Co., Ltd.) as a polyallylamine series polymer having a hydroxyl group as a counter ion, it was coated on a polyethylene terephthalate film (available from Teijin DuPont Films Japan Limited) having a thickness of 100 μm and had been subjected to a treatment to heighten adhesiveness with the coated layer with a dry film thickness of 2 μm and dried.

<Preparation of Support 5>

10 g of polyvinyl alcohol PVA405 (available from KURARAY CO., LTD.) was dissolved in 90 g of deionized water. To the solution was added 4 g of Pyurakemu WT (available from Rikengreen Co., Ltd.) which is polyaluminum hydroxide having a chlorine ion as a counter ion, and the mixture was coated on a polyethylene terephthalate film (available from Teijin DuPont Films Japan Limited) having a thickness of 100 μm and had been subjected to a treatment to heighten adhesiveness with the coated layer with a dry film thickness of 5 μm and dried.

<Preparation of Support 6>

10 g of polyvinyl alcohol PVA405 (available from KURARAY CO., LTD.) was dissolved in 90 g of deionized water. To the solution was added 2 g of sodium chloride, and the mixture was coated on a polyethylene terephthalate film (available from Teijin DuPont Films Japan Limited) having a thickness of 100 μm and had been subjected to a treatment to heighten adhesiveness with the coated layer with a dry film thickness of 5 μm and dried.

<Preparation of Support 7>

10 g of polyvinyl alcohol PVA405 (available from KURARAY CO., LTD.) was dissolved in 90 g of deionized water. To the solution was added 2 g of sodium bromide, and the mixture was coated on a polyethylene terephthalate film (available from Teijin DuPont Films Japan Limited) having a thickness of 100 μm and had been subjected to heighten adhesiveness with the coated layer with a dry film thickness of 5 μm and dried.

<Preparation of Support 8>

10 g of polyvinyl alcohol PVA405 (available from KURARAY CO., LTD.) was dissolved in 90 g of deionized water. To the solution was added 2 g of ammonium chloride, and the mixture was coated on a polyethylene terephthalate film (available from Teijin DuPont Films Japan Limited) having a thickness of 100 μm and had been subjected to a treatment to heighten adhesiveness with the coated layer with a dry film thickness of 5 μm and dried.

<Preparation of Support 9>

10 g of polyvinyl alcohol PVA405 (available from KURARAY CO., LTD.) was dissolved in 90 g of deionized water, and the mixture was coated on a polyethylene terephthalate film (available from Teijin DuPont Films Japan Limited) having a thickness of 100 μm and had been subjected to a treatment to heighten adhesiveness with the coated layer with a dry film thickness of 5 μm and dried.

<Preparation of Support 10>

10 g of polyvinyl alcohol PVA405 (available from KURARAY CO., LTD.) was dissolved in 90 g of deionized water, and the mixture was coated on a polyethylene terephthalate film (available from Teijin DuPont Films Japan Limited) having a thickness of 100 μm and had been subjected to a treatment to heighten adhesiveness with the coated layer with a dry film thickness of 15 μm and dried.

<Preparation of Support 11>

10 g of polyvinyl alcohol PVA-117 (available from KURARAY CO., LTD.) was dissolved in 90 g of deionized water, and the mixture was coated on a polyethylene terephthalate film (available from Teijin DuPont Films Japan Limited) having a thickness of 100 μm and had been subjected to a treatment to heighten adhesiveness with the coated layer with a dry film thickness of 15 μm and dried.

<Preparation of Sodium Chloride Coating Solution 1>

5% by weight of aqueous an sodium chloride solution was prepared by using pure water, and 0.1% by weight of alkylene glycol series nonionic surfactant was added to the solution to prepare Sodium chloride coating solution 1.

<Preparation of Support 12>

On Support 10 was coated Sodium chloride coating solution 1 by using a #6 wire bar. An amount of the coated sodium chloride was 0.6 g/m$^2$.

<Preparation of Support 13>

In 90 g of deionized water were dissolved 3 g of alkali-treated gelatin (available from Nitta Gelatin Inc.), 4 g of polyvinylpyrrolidone PVP-K90 (available from ISP Co.) and 0.3 g of an epoxy series cross-linking agent DENACOL EX-521 (available from Nagase ChemteX Corporation) as a film-hardening agent, and the mixture was coated on a polyethylene terephthalate film (available from Teijin DuPont Films Japan Limited) having a thickness of 100 μm and had been subjected to a treatment to heighten adhesive-ness with the coated layer so as to have a dry film thick-ness of 15 μm, and dried.

<Preparation of Support 14>

On Support 13 was coated Sodium chloride coating solution 1 by using a #6 wire bar. An amount of the coated sodium chloride was 0.6 g/m$^2$.

<Preparation of Support 15>

To water was added precipitated silica (Oil absorption amount; 200 ml/100 g, average primary particle size; 16 nm, average secondary particle size: 9 μm), and a provisional dispersion was prepared by using a saw blade type dispersing device (blade peripheral speed: 30 m/sec). Next, the obtained provisional dispersion was treated by beads mill (using 0.3 mmφ zirconia beads) to obtain Inorganic fine particle dispersion 1 with a concentration of a solid content of 30% by weight. An average secondary particle size of the dispersed silica was 250 nm.

The above-mentioned inorganic fine particle dispersion 1 and other chemicals were mixed at 50° C. to prepare Porous layer-forming coating solution 1 having the following composition.

<Porous Layer-Forming Coating Solution 1>

| | |
|---|---|
| Inorganic fine particle dispersion 1 (as a silica solid content) | 100 g |
| Polyvinyl alcohol (Saponification degree: 88%, average polymerization degree: 3500) | 16 g |
| Boric acid | 3 g |
| Nonionic surfactant | 0.3 g |

(Polyoxyethylene Alkyl Ether)
A concentration of the solid content was adjusted to 12% by weight with water.

Porous layer-forming coating solution 1 was coated on a polyethylene terephthalate film (available from Teijin DuPont Films Japan Limited) having a thickness of 100 μm and had been subjected to a treatment to heighten adhesiveness with the coated layer so that the inorganic fine particles became 20 g per 1 $m^2$, and dried.

<Preparation of Support 16>
To Porous layer-forming coating solution 1 was added 4 g of Polyfix 601 (available from SHOWA HIGHPOLYMER CO., LTD.) in terms of a solid content, which is a polyamine resin having a chlorine ion as a counter ion, and the mixture was coated on a polyethylene terephthalate film (available from Teijin DuPont Films Japan Limited) having a thickness of 100 μm and had been subjected to a treatment to heighten adhesiveness with the coated layer so that the inorganic fine particles became 20 g per 1 $m^2$, and dried.

<Preparation of Support 17>
On Support 15 was coated Sodium chloride coating solution 1 by using a #6 wire bar. An amount of the coated sodium chloride was 0.7 g/$m^2$.

<Preparation of Support 18>
To water was added fumed silica (Average primary particle size: 7 nm, specific surface area: 300 $m^2$/g) as inorganic fine particles, and a provisional dispersion was prepared by using a saw blade type dispersing device (blade peripheral speed: 30 m/sec). Next, the obtained provision-al dispersion was treated by beads mill (using 0.3 mmϕ zirconia beads) to obtain Inorganic fine particle dispersion 2 with a concentration of a solid content of 10% by weight. An average secondary particle size was 120 nm.

By using the above-mentioned inorganic fine particle dispersion 2, Porous layer-forming coating solution 2 having the following composition was prepared.

<Porous Layer-Forming Coating Solution 2>

| | |
|---|---|
| Inorganic fine particle dispersion 2 (as a silica solid content) | 100 g |
| Polyvinyl alcohol (Saponification degree: 88%, average polymerization degree: 3500) | 25 g |
| Boric acid | 4 g |
| Nonionic surfactant | 0.3 g |

(Polyoxyethylene Alkyl Ether)
A concentration of the solid content was adjusted to 8% by weight with water.

Porous layer-forming coating solution 2 was coated on a polyethylene terephthalate film (available from Teijin DuPont Films Japan Limited) having a thickness of 100 μm and had been subjected to a treatment to heighten adhesiveness with the coated layer so that the inorganic fine particles became 20 g per 1 $m^2$, and dried.

<Preparation of Support 19>
Mucochloric acid which is a compound having a halogen in the molecule by a covalent bond is dissolved in ethanol with 5% by weight, and the solution was coated on the support 18 by using a #6 wire bar. An amount of the coated mucohloric acid was 0.6 g/$m^2$.

<Preparation of Support 20>
5-Chlorobenzotriazole which is a compound having a halogen in the molecule by a covalent bond is dissolved in ethanol with 5% by weight, and the solution was coated on the support 18 by using a #6 wire bar. An amount of the coated 5-chlorobenzotriazole was 0.6 g/$m^2$.

<Preparation of Support 21>
To Porous layer-forming coating solution 2 was added 4 g of Pyurakemu WT (available from Rikengreen Co., Ltd.) which is polyaluminum hydroxide having a chlorine ion as a counter ion, and the mixture was coated on a polyethylene terephthalate film (available from Teijin DuPont Films Japan Limited) having a thickness of 100 μm and had been subjected to a treatment to heighten adhesiveness with the coated layer so that the inorganic fine particles became 20 g per 1 $m^2$, and dried.

<Preparation of Support 22>
On Support 18 was coated Sodium chloride coating solution 1 by using a #6 wire bar. An amount of the coated sodium chloride was 0.7 g/$m^2$.

<Preparation of Support 23>
To water were added 8 parts by weight of Sharol DC902P (available from Dai-ichi Kogyo Seiyaku Co., Ltd.) which is a diallyldimethyl ammonium chloride-polymerized material having a chlorine ion as a counter ion, and 100 parts by weight of fumed silica (average primary particle size: 7 nm, specific surface area: 300 $m^2$/g) as inorganic fine particles, and a provisional dispersion was prepared by using a saw blade type dispersing device (blade peripheral speed: 30 m/sec). Next, the obtained provisional dispersion was treated by a high pressure homogenizer to obtain Inorganic fine particle dispersion 3 with a concentration of a solid content of 20% by weight. An average secondary particle size was 130 nm.

By using the above-mentioned Inorganic fine particle dispersion 3, Porous layer-forming coating solution 3 having the following mentioned composition was prepared.

<Porous Layer-Forming Coating Solution 3>

| | |
|---|---|
| Inorganic fine particle dispersion 3 (as a silica solid content) | 100 g |
| Polyvinyl alcohol (Saponification degree: 88%, average polymerization degree: 3500) | 25 g |
| Boric acid | 4 g |
| Nonionic surfactant | 0.3 g |

(Polyoxyethylene Alkyl Ether)
A concentration of the solid content was adjusted to 13% by weight with water.

Porous layer-forming coating solution 3 was coated on a polyethylene terephthalate film (available from Teijin DuPont Films Japan Limited) having a thickness of 100 μm and had been subjected to a treatment to heighten adhesiveness with the coated layer so that the inorganic fine particles became 10 g per 1 $m^2$, and dried.

<Preparation of Support 24>

Porous layer-forming coating solution 3 was coated on a polyethylene terephthalate film (available from Teijin DuPont Films Japan Limited) having a thickness of 100 μm and had been subjected to a treatment to heighten adhesiveness with the coated layer so that the inorganic fine particles became 20 g per 1 $m^2$, and dried.

<Preparation of Support 25>

By using the above-mentioned Inorganic fine particle dispersion 3, Porous layer-forming coating solution 4 having the following mentioned composition was prepared. By using Porous layer-forming coating solution 4 as an under layer, and Coating solution 1 containing a cross linking agent having the following mentioned composition as an upper layer, they were subjected to simultaneous double-layer coating by a slide bead coating device on a poly-ethylene terephthalate film (available from Teijin DuPont Films Japan Limited) having a thickness of 100 μm and had been subjected to a treatment to heighten adhesiveness with the coated layer so that the inorganic fine particles became 35 g per 1 $m^2$ and the adipic acid dihydrazide became 0.8 g per 1 $m^2$, and dried.

<Porous Layer-Forming Coating Solution 4>

| | |
|---|---|
| Inorganic fine particle dispersion 3 (as a silica solid content) | 1000 g |
| Acetacetyl-modified polyvinyl alcohol (Acetacetylation degree: 3%, saponification degree: 98%, average polymerization degree: 2350) | 230 g |
| Nonionic surfactant | 3 g |

(Polyoxyethylene Alkyl Ether)
A concentration of the solid content was adjusted to 12% by weight with water.

<Cross-Linking Agent-Containing Coating Solution 1>

| | |
|---|---|
| Adipic acid dihydrazide | 100 g |
| Nonionic surfactant | 2 g |

(Polyoxyethylene Alkyl Ether)
Made up the total amount 2000 g with water.

<Preparation of Support 26>

By using the above-mentioned Inorganic fine particle dispersion 3, Porous layer-forming coating solution 5 having the following mentioned composition was prepared.

<Porous Layer-Forming Coating Solution 5>

| | |
|---|---|
| Inorganic fine particle dispersion 3 (as a silica solid content) | 100 g |
| Urethane acrylate series resin (NK Oligo UA-7100 available from Shin-Nakamura Kagaku Kogyo K.K.) | 60 g |
| Photopolymerization initiator | 1 g |

2-Hydroxy-2-methyl-1-phenyl-propane-1-one

A concentration of the solid content was adjusted to 40% by weight with water.

Porous layer-forming coating solution 5 was coated on a polyethylene terephthalate film (available from Teijin DuPont Films Japan Limited) having a thickness of 100 μm and had been subjected to a treatment to heighten adhesiveness with the coated layer so that the inorganic fine particles became 20 g per 1 $m^2$, cured by passing under a UV lamp with an irradiation energy of 80 W/cm with a conveying rate of 9 m/minute, and dried.

<Preparation of Support 27>

By using the following mentioned Porous layer-forming coating solution 6, it was coated on a polyethylene terephthalate film (available from Teijin DuPont Films Japan Limited) having a thickness of 100 μm and had been subjected to a treatment to heighten adhesiveness with the coated layer so that the inorganic fine particles became 20 g per 1 $m^2$, and dried. Wet silica used in Porous layer-forming coating solution 6 is a type of the so-called gel method silica, and an average primary particle size is 100 nm or lower, but the primary particles are firmly bonded to each other and an average secondary particle size is 6 μm. Since it was carried out simple mixing without carrying out pulverization and dispersing treatment using beads mill as in Inorganic fine particle dispersion 1, so that an average secondary particle size in Porous layer-forming coating solution 6 was 6 μm.

<Porous Layer-Forming Coating Solution 6>

| | |
|---|---|
| Wet silica (Mizukasil P78A available from Mizusawa Chemical Industries, Ltd., an average secondary particle size: 6 μm) | 100 g |
| Polyvinyl alcohol (Saponification degree: 98%, average polymerization degree: 1700) | 50 g |
| Nonionic surfactant | 0.3 g |

(Polyoxyethylene Alkyl Ether)
A concentration of the solid content was adjusted to 15% by weight with water.

<Preparation of Support 28>

Sodium chloride coating solution 1 was coated on Support 27 by using a #6 wire bar. An amount of the coated sodium chloride was 0.7 g/$m^2$.

<Preparation of Support 29>

To water were added nitric acid (2.5 parts by weight) and alumina hydrate (average primary particle size: 15 nm), Inorganic fine particle dispersion 4 with a concentration of a solid component of 30% by weight was obtained by using a saw blade type dispersing device. The average secondary particle size was 160 nm.

By using the above-mentioned Inorganic fine particle dispersion 4, Porous layer-forming coating solution 7 having the following mentioned composition was prepared.

<Porous Layer-Forming Coating Solution 7>

| | |
|---|---|
| Inorganic fine particle dispersion 4 (as alumina hydrate solid component) | 100 g |
| Polyvinyl alcohol (Saponification degree: 88%, average polymerization degree: 3500) | 12 g |
| Boric acid | 0.5 g |
| Nonionic surfactant | 0.3 g |

(Polyoxyethylene Alkyl Ether)
A concentration of the solid content was adjusted to 16% by weight with water.

Porous layer-forming coating solution 7 was coated on a polyethylene terephthalate film (available from Teijin DuPont Films Japan Limited) having a thickness of 100 μm and had been subjected to a treatment to heighten adhesiveness with the coated layer so that the inorganic fine particles became 20 g per 1 $m^2$, and dried.

<Preparation of Support 30>

On the support 29 was coated Sodium chloride coating solution 1 by using a #6 wire bar. An amount of the coated sodium chloride was 0.7 g/m$^2$.

<Preparation of Support 31>

By using the following mentioned Porous layer-forming coating solution 8, it was coated on a polyethylene terephthalate film (available from Teijin DuPont Films Japan Limited) having a thickness of 100 μm and had been subjected to a treatment to heighten adhesiveness with the coated layer so that the inorganic fine particles became 20 g per 1 m$^2$, and dried. The organic fine particles used in Porous layer-forming coating solution 8 has a glass transition point of 75° C., so that preparation of the coating solution, coating and drying were carried out not exceeding a temperature of 30° C. to prevent from formation of the porous layer.

<Porous Layer-Forming Coating Solution 8>

| | |
|---|---|
| Styrene acrylic resin (Average primary particle size: 70 nm, glass transition temperature 75° C., Lowest film-forming temperature: 80° C., concentration: 30% by weight) | 100 g |
| Polyvinyl alcohol (Saponification degree: 98%, average polymerization degree: 1700) | 8 g |
| Nonionic surfactant | 0.3 g |

(Polyoxyethylene Alkyl Ether)

A concentration of the solid content was adjusted to 25% by weight with water.

<Preparation of Support 32>

On the support 31 was coated Sodium chloride coating solution 1 by using a #6 wire bar. An amount of the coated sodium chloride was 0.7 g/m$^2$.

<Preparation of Conductive Material>

On the supports 1 to 32 were coated various kinds of metal colloid solutions using a #6 wire bar, then, the metal thin films formed on the respective supports were cut with the supports with a size of 80 mm×50 mm, to make them as conductive materials. The metal colloid solutions used are the above-mentioned aqueous silver colloid solution 1 as Metal colloid 1, the above-mentioned aqueous silver colloid solution 2 as Metal colloid 2, the above-mentioned aqueous silver colloid solution 3 as Metal colloid 3, AGIN-W4A (a particle size of ultra fine silver particles is about 15 nm) which is an aqueous silver nano ink and available from Sumitomo Electric Industries, Ltd., as Metal colloid 4, IJ241-4 (having metal ultra fine particles containing 2 parts by weight of copper based on 100 parts by weight of silver. A particle size is about 50 nm) which is an aqueous silver-copper complex nano ink and available from Cima NanoTech Inc., as Metal colloid 5, and AG1TeH (a particle size of ultra fine silver particles is about 10 nm) which is an organic solvent series silver nano ink and available from ULVAC Materials, Inc., as Metal colloid 6. Coating of the metal colloid was carried out at 15° C. and 27% Rh (Weight absolute humidity H=0.0029 kg/kg D.A.). The conductive patterns formed from the aqueous Metal colloids 1 to 5 were dried under conditions of 15° C. and 27% Rh, and the conductive pattern formed from the organic solvent series metal colloid 6 was subjected to drying at 100° C. (relative humidity: 1% Rh or less) so as to evaporate the contained high-boiling point solvent (n-tetradecane) with a certain degree.

With regard to the obtained respective conductive materials, the following evaluations were carried out and the results are shown in Table 10.

<Conductivity>

With regard to the respective conductive materials, a silver amount per 1 m$^2$ was measured by using a fluorescent X-ray analyzer (RIX1000 manufactured by Rigaku Corporation). Sheet resistance values of the respective conductive materials were measured by using Loresta GP/ESP probe manufactured by DIA INSTRUMENTS CO., LTD., under the conditions of 23° C. and 50% Rh. With regard to the various kinds of metal thin films, a theoretical sheet resistance value was calculated from the obtained silver amount per 1 m$^2$, and compared it with the actually observed sheet resistance value. When a calculation of the theoretical sheet resistance value is exemplified, for example, in the sample in which Metal colloid 1 was coated on the support 24, the silver amount per 1 m$^2$ measured by the fluorescent X-ray analyzer was 4.7 g, and a calculated thickness is $4.48 \times 10^{-5}$ cm when it is divided by a specific gravity of 10.5. The sheet resistance value can be obtained by dividing the volume resistance value of silver, $1.59 \times 10^{-6}$ Ω·cm, by the thickness, and the value can be calculated to be 0.0355Ω/□. With regard to Metal colloid 3 and Metal colloid 5, palladium or copper is contained but it is a minute amount as 2% by weight or so, so that in this evaluation, the sheet resistance value was calculated based on the silver amount alone measured by the fluorescent X-ray analyzer. With regard to the theoretical sheet resistance value, evaluation was carried out based on the following criteria.

○: Less than 10-fold of the theoretical sheet resistance value

Δ: 10-Fold or more and less than 10000-fold of the theoretical sheet resistance value X: 10000-Fold or more of the theoretical sheet resistance value --: No conductivity For example, in the sample in which Metal colloid 1 was coated on the support 24, if the measured sheet resistance value is less than 0.355Ω, it is ○, 0.355Ω or higher and less than 355Ω is Δ, 355Ω or higher is X, and it becomes impossible to measure due to over range display, it is an evaluation of --.

TABLE 10

| Support | Metal colloid 1 | Metal colloid 2 | Metal colloid 3 | Metal colloid 4 | Metal colloid 5 | Metal colloid 6 | Remarks |
|---|---|---|---|---|---|---|---|
| 1 | Δ | X | X | X | X | — | Present invention |
| 2 | Δ | X | X | X | X | — | Present invention |
| 3 | Δ | X | X | X | X | — | Present invention |
| 4 | — | — | — | — | — | — | Comparative |
| 5 | Δ | X | X | X | X | — | Present invention |
| 6 | Δ | Δ | Δ | X | X | — | Present invention |

TABLE 10-continued

| Support | Metal colloid 1 | Metal colloid 2 | Metal colloid 3 | Metal colloid 4 | Metal colloid 5 | Metal colloid 6 | Remarks |
|---|---|---|---|---|---|---|---|
| 7 | Δ | Δ | Δ | X | X | — | Present invention |
| 8 | Δ | Δ | Δ | X | X | — | Present invention |
| 9 | — | — | — | — | — | — | Comparative |
| 10 | — | — | — | — | — | — | Comparative |
| 11 | — | — | — | — | — | — | Comparative |
| 12 | Δ | Δ | Δ | Δ | X | — | Present invention |
| 13 | — | — | — | — | — | — | Comparative |
| 14 | ○ | Δ | Δ | Δ | X | — | Present invention |
| 15 | — | — | — | — | — | — | Comparative |
| 16 | ○ | ○ | ○ | Δ | X | — | Present invention |
| 17 | ○ | ○ | ○ | Δ | X | — | Present invention |
| 18 | — | — | — | — | — | — | Comparative |
| 19 | — | — | — | — | — | — | Comparative |
| 20 | — | — | — | — | — | — | Comparative |
| 21 | ○ | ○ | ○ | Δ | X | — | Present invention |
| 22 | ○ | ○ | ○ | Δ | X | — | Present invention |
| 23 | Δ | Δ | Δ | Δ | X | — | Present invention |
| 24 | ○ | ○ | ○ | Δ | X | — | Present invention |
| 25 | ○ | Δ | Δ | Δ | X | — | Present invention |
| 26 | ○ | ○ | ○ | Δ | X | — | Present invention |
| 27 | — | — | — | — | — | — | Comparative |
| 28 | ○ | ○ | Δ | Δ | X | — | Present invention |
| 29 | — | — | — | — | — | — | Comparative |
| 30 | Δ | Δ | Δ | X | X | — | Present invention |
| 31 | — | — | — | — | — | — | Comparative |
| 32 | ○ | Δ | Δ | X | X | — | Present invention |

As can be clearly seen from Table 10, in the present invention, good conductivity is shown by Metal colloid 1. A thickness of the undercoating layer is thicker, better conductivity is shown, and particularly in the case of forming the porous layer, better conductivity is shown. By comparing the supports 3 and 4, it can be understood that even when a cationic polymer is contained, no conductivity appears in the polymer having no chlorine ion. In Comparative example containing no water-soluble halogen compound in the support and Comparative example containing a compound having halogen in the molecule by a covalent bond in the support (support 19 and support 20), no conductivity is shown.

Example 12

The conductive material of Example 11 was allowed to stand under high humidity conditions at 50° C. and 80% Rh (weight absolute humidity H=0.067 kg/kg D.A.) for 1 hour. Thereafter, the sheet resistance value was measured under the conditions of 23° C. and 50% Rh in the same manner as in Example 11 and the results are shown in Table 11.

TABLE 11

| Support | Metal colloid 1 | Metal colloid 2 | Metal colloid 3 | Metal colloid 4 | Metal colloid 5 | Metal colloid 6 | Remarks |
|---|---|---|---|---|---|---|---|
| 1 | Δ | Δ | Δ | Δ | Δ | Δ | Present invention |
| 2 | Δ | Δ | Δ | Δ | Δ | Δ | Present invention |
| 3 | Δ | Δ | Δ | Δ | Δ | Δ | Present invention |
| 4 | — | — | — | — | — | — | Comparative |
| 5 | ○ | Δ | Δ | Δ | Δ | Δ | Present invention |
| 6 | ○ | Δ | Δ | Δ | Δ | Δ | Present invention |
| 7 | ○ | Δ | Δ | Δ | Δ | Δ | Present invention |

TABLE 11-continued

| Support | Metal colloid 1 | Metal colloid 2 | Metal colloid 3 | Metal colloid 4 | Metal colloid 5 | Metal colloid 6 | Remarks |
|---|---|---|---|---|---|---|---|
| 8 | ○ | Δ | Δ | Δ | Δ | Δ | Present invention |
| 9 | — | — | — | — | — | — | Comparative |
| 10 | — | — | — | — | — | — | Comparative |
| 11 | — | — | — | — | — | — | Comparative |
| 12 | ○ | Δ | Δ | Δ | Δ | Δ | Present invention |
| 13 | — | — | — | — | — | — | Comparative |
| 14 | ○ | ○ | Δ | Δ | Δ | Δ | Present invention |
| 15 | — | — | — | — | — | — | Comparative |
| 16 | ○ | ○ | Δ | ○ | Δ | ○ | Present invention |
| 17 | ○ | ○ | ○ | ○ | Δ | ○ | Present invention |
| 18 | — | — | — | — | — | — | Comparative |
| 19 | — | — | — | — | — | — | Comparative |
| 20 | — | — | — | — | — | — | Comparative |
| 21 | ○ | ○ | ○ | ○ | Δ | ○ | Present invention |
| 22 | ○ | ○ | ○ | ○ | Δ | ○ | Present invention |
| 23 | ○ | Δ | Δ | Δ | Δ | ○ | Present invention |
| 24 | ○ | ○ | ○ | ○ | Δ | ○ | Present invention |
| 25 | ○ | ○ | ○ | ○ | Δ | ○ | Present invention |
| 26 | ○ | ○ | ○ | ○ | Δ | ○ | Present invention |
| 27 | — | — | — | — | — | — | Comparative |
| 28 | ○ | ○ | ○ | ○ | Δ | Δ | Present invention |
| 29 | — | — | — | — | — | — | Comparative |
| 30 | ○ | ○ | Δ | Δ | Δ | Δ | Present invention |
| 31 | — | — | — | — | — | — | Comparative |
| 32 | ○ | ○ | ○ | Δ | Δ | Δ | Present invention |

As can be clearly seen from Table 11, in the present invention, by allowing the conductive materials to stand under high humidity conditions, conductivity is markedly improved. In Comparative example containing no water-soluble halogen compound in the support and Comparative example containing a compound having halogen in the molecule by a covalent bond in the support (support 19 and support 20), no conductivity is shown even when they are allowed to stand under high humidity conditions.

Example 13

<Preparation of Conductive Material 1>

Metal colloid 1 was coated on a polyethylene terephthalate film (available from Teijin DuPont Films Japan Limited) having a thickness of 100 μm and had been subjected to a treatment to heighten adhesiveness with the coated layer by using a wire bar and dried at 50° C. to obtain Conductive material 1. A silver amount measured by using a fluorescent X-ray analyzer (RIX1000 manufactured by Rigaku Corporation) was 2.0 g per 1 m$^2$.

<Preparation of Conductive Material 2>

Conductive material 1 was heated at 100° C. for 1 hour to obtain Conductive material 2.

<Preparation of Conductive Material 3>

Conductive material 1 was dipped in Treating solution 2-1 having the following mentioned composition and heat-controlled to 70° C. for 10 seconds, then, dipped in warm pure water for 2 seconds to wash the treating solution attached to the surface, and dried at 50° C. to obtain Conductive material 3.

<Treating solution 2-1>

| Phosphinic acid sodium monohydrate | 30 g |
|---|---|
| Pure water | 70 g |

<Preparation of Conductive Material 4>

Conductive material 1 was dipped in Treating solution 2-2 having the following mentioned composition and heat-controlled to 70° C. for 60 seconds, then, dipped in warm pure water for 2 seconds to wash the treating solution attached to the surface, and dried at 50° C. to obtain Conductive material 4.

<Treating Solution 2-2>

| Glyoxal | 40 g |
|---|---|
| Pure water | 60 g |

<Preparation of Conductive Material 5>

Conductive material 1 was dipped in Treating solution 2-3 having the following mentioned composition and heat controlled to 70° C. for 60 seconds, then, dipped in warm pure water for 2 seconds to wash the treating solution attached to the surface, and dried at 50° C. to obtain Conductive material 5.
<Treating Solution 2-3>

| Dextrin | 20 g |
|---|---|
| Pure water | 75 g |
| 1N aqueous sodium hydroxide solution | 5 g |

<Preparation of Conductive Material 6>
Conductive material 1 was dipped in Treating solution 2-4 having the following mentioned composition and heat-controlled to 70° C. for 10 seconds, then, dipped in warm pure water for 2 seconds to wash the treating solution attached to the surface, and dried at 50° C. to obtain Conductive material 6.
<Treating Solution 2-4>

| Hydrazinium sulfate | 1.65 g |
|---|---|
| Pure water | 98.35 g |

<Preparation of Conductive Material 7>
Conductive material 1 was dipped in Treating solution 2-5 having the following mentioned composition and heat-controlled to 70° C. for 10 seconds, then, dipped in warm pure water for 2 seconds to wash the treating solution attached to the surface, and dried at 50° C. to obtain Conductive material 7.
<Treating Solution 2-5>

| Paramethylaminophenol sulfate | 4.5 g |
|---|---|
| Pure water | 95.5 g |

<Preparation of Conductive Material 8>
Conductive material 1 was dipped in Treating solution 2-6 having the following mentioned composition and heat-controlled to 70° C. for 60 seconds, then, dipped in warm pure water for 2 seconds to wash the treating solution attached to the surface, and dried at 50° C. to obtain Conductive material 8.
<Treating Solution 2-6>

| Hydroquinone monosulfonic acid Potassium | 24 g |
|---|---|
| Pure water | 76 g |

<Preparation of Conductive Material 9>
Conductive material 1 was dipped in Treating solution 2-7 having the following mentioned composition and heat-controlled to 70° C. for 60 seconds, then, dipped in warm pure water for 2 seconds to wash the treating solution attached to the surface, and dried at 50° C. to obtain Conductive material 9.
<Treating Solution 2-7>

| Thiourea dioxide | 2.5 g |
|---|---|
| Pure water | 97.5 g |

<Preparation of Conductive Material 10>
Conductive material 1 was dipped in Treating solution 2-8 having the following mentioned composition and heat-controlled to 70° C. for 10 seconds, then, dipped in warm pure water for 2 seconds to wash the treating solution attached to the surface, and dried at 50° C. to obtain Conductive material 10.
<Treating Solution 2-8>

| L(+)-ascorbic acid | 24 g |
|---|---|
| Pure water | 71 g |
| 1N aqueous sodium hydroxide solution | 5 g |

<Preparation of Conductive Material 11>
Conductive material 1 was dipped in Treating solution 2-9 having the following mentioned composition and heat-controlled to 70° C. for 180 seconds, then, dipped in warm pure water for 2 seconds to wash the treating solution attached to the surface, and dried at 50° C. to obtain Conductive material 11.
<Treating Solution 2-9>

| Citric acid (anhydride) | 50 g |
|---|---|
| Pure water | 50 g |

<Preparation of Conductive Material 12>
Conductive material 1 was dipped in Treating solution 2-10 having the following mentioned composition and heat-controlled to 70° C. for 60 seconds, then, dipped in warm pure water for 2 seconds to wash the treating solution attached to the surface, and dried at 50° C. to obtain Conductive material 12.
<Treating Solution 2-10>

| Trisodium citrate dihydrate | 30 g |
|---|---|
| Pure water | 70 g |

<Preparation of Conductive Material 13>
Conductive material 1 was dipped in Treating solution 2-11 having the following mentioned composition and heat-controlled to 70° C. for 5 seconds, then, dipped in warm pure water for 2 seconds to wash the treating solution attached to the surface, and dried at 50° C. to obtain Conductive material 13.
<Treating Solution 2-11>

| Hydrogenated boronsodium | 2.5 g |
|---|---|
| 1N aqueous sodium hydroxide solution | 97.5 g |

<Preparation of Conductive Material 14>
To 1 g of Metal colloid 1 was added 0.1 g of dextrin to dissolve therein. This silver colloid solution was coated on a polyethylene terephthalate film (available from Teijin DuPont Films Japan Limited) having a thickness of 100 μm and had been subjected to a treatment to heighten adhesiveness with the coated layer by using a wire bar, and dried at 50° C. to obtain Conductive material 14. A silver amount measured by using a fluorescent X-ray analyzer was 1.9 g per 1 $m^2$.

<Preparation of Conductive Material 15>

To 1 g of Metal colloid 1 was added 0.1 g of citric acid (anhydrous) to dissolve therein. This silver colloid solution was coated on a polyethylene terephthalate film (available from Teijin DuPont Films Japan Limited) having a thickness of 100 μm and had been subjected to a treatment to heighten adhesiveness with the coated layer by using a wire bar, and dried at 50° C. to obtain Conductive material 15. A silver amount measured by using a fluorescent X-ray analyzer was 2.0 g per 1 m$^2$.

<Preparation of Conductive Material 16>

To 1 g of Metal colloid 1 was added 0.1 g of tri-sodium citrate dihydrate to dissolve therein, This silver colloid solution was coated on a polyethylene terephthalate film (available from Teijin DuPont Films Japan Limited) having a thickness of 100 μm and had been subjected to a treatment to heighten adhesiveness with the coated layer by using a wire bar, and dried at 50° C. to obtain Conductive material 16. A silver amount measured by using a fluorescent X-ray analyzer was 2.0 g per 1 m$^2$.

<Practice of Water-Supplying Treatment>

Conductive materials 1 to 16 were allowed to stand under high humidity conditions at 50° C. and 80% Rh (weight absolute humidity H=0.067 kg/kgD.A.) for 2 hours.

Sheet resistance values of Conductive materials 1 to 16 were measured under the conditions of 23° C. and 50% Rh in the same manner as in Example 11 and the results are shown in Table 12.

TABLE 12

| Conductive material | Before water-supplying treatment | After water-supplying treatment | Remarks |
|---|---|---|---|
| Conductive material 1 | — | — | Comparative |
| Conductive material 2 | — | — | Comparative |
| Conductive material 3 | Δ | ○ | Present invention |
| Conductive material 4 | Δ | Δ | Present invention |
| Conductive material 5 | Δ | Δ | Present invention |
| Conductive material 6 | Δ | ○ | Present invention |
| Conductive material 7 | Δ | Δ | Present invention |
| Conductive material 8 | Δ | ○ | Present invention |
| Conductive material 9 | ○ | ○ | Present invention |
| Conductive material 10 | Δ | ○ | Present invention |
| Conductive material 11 | Δ | ○ | Present invention |
| Conductive material 12 | Δ | ○ | Present invention |
| Conductive material 13 | ○ | ○ | Present invention |
| Conductive material 14 | — | — | Comparative |
| Conductive material 15 | — | — | Comparative |
| Conductive material 16 | — | — | Comparative |

As can be clearly seen from Table 12, Conductive materials 3 to 13 of the present invention show conductivity. Also, by carrying out the water-supplying treatment, improvement in conductivity can be observed.

Example 14

By using Metal colloid 6, a straight line with a length of 1 cm was drawn on a polyethylene terephthalate film (available from Teijin DuPont Films Japan Limited) having a thickness of 100 μm and had been subjected to a treatment to heighten adhesiveness with the coated layer by using a dispenser. After drying at 100° C. (relative humidity of 1% Rh or less), when a shape of the drawn straight line pattern was measured by using Surfcom, Type 1400A manufactured by TOKYO SEIMITSU CO., LTD., then it was an average thickness of 4 μm and a width of 1 mm. A resistance value of this straight line pattern was measured by the following resistance value evaluation method, but it showed over range and no conductivity was observed.

The linear pattern was dipped in the following Treating solution 2-12 for 30 minutes and then a resistance value resistance value was measured according to the evaluation method. Further, it was allowed to stand under the conditions at 50° C. and 80% Rh for 12 hours, and then, a resistance value was measured again. The results are shown in Table 13.

<Treating Solution 2-12>

5% by weight aqueous sodium chloride solution

Similarly, it was treated by the following Treating solutions 2-13 and 2-14, and the same measurement was carried out. The results are also shown in Table 13.

<Treating Solution 2-13>

5% by weight aqueous sodium bromide solution

<Treating Solution 2-14>

5% by weight aqueous Sharol DC902P (available from Dai-ichi Kogyo Seiyaku Co., Ltd.) solution Evaluation method of the resistance value is shown below.

<Resistance Value>

A resistance value between both ends of the straight line pattern was measured by a tester (Type PC500, manufactured by SANWA DENKI KOGYO CO., LTD.) under the conditions of 23° C. and 50% Rh.

TABLE 13

| Treating solution | Resistance value before dipping in treating solution | Resistance value (Ω) after dippig in treating solution for 30 min | Resistance value (Ω) after allowing to stand under 50° C. and 80% Rh | Remarks |
|---|---|---|---|---|
| 2-12 | No conductivity | 15 | 2 | Present invention |
| 2-13 | No conductivity | 30 | 1 | Present invention |
| 2-14 | No conductivity | 45 | 2 | Present invention |
| Non-treated material | No conductivity | — | No conductivity | Comparative |

As can be clearly seen from Table 13, in the non-treated material which had not been dipped in the treating solution, no conductivity is shown. Straight line patterns treated by Treating solutions 2-13 to 2-14 of the present invention show high conductivity, and in particular, it can be understood that the samples allowing to stand under high humidity conditions show extremely low resistance value.

Example 15

Silver ink 1 prepared by diluting Metal colloid 4 with the following mentioned formulation was filled in an ink-jet printer (manufactured by Seiko Epson Co., Stylus C82) using commercially available pigment ink in place of pigment inks in each cartridge of cyan, magenta, yellow and black.

<Silver Ink 1>

| | |
|---|---|
| Metal colloid 4 | 50 cm$^3$ |
| Deionized water | 60 cm$^3$ |

On the supports 15 and 17 prepared in Example 11, a pattern constituted only by black with a size of 80 m×50 mm was printed. With regard to printing conditions, a paper to be used was made Glossy Photo Paper, and Best Photo mode was employed. Printing was carried out under the conditions of 23° C. and 50% Rh.

A sheet resistance value immediately after the printing was measured in the same manner as in Example 11, and respective sheet resistance values after allowing to stand under the conditions of 50° C. and 80% Rh for 2 minutes and 1 hour were measured. The results are shown in Table 14. A silver amount at the printed portion measured by a fluorescent X-ray analyzer was 2.02 g per 1 $m^2$, and when a theoretical sheet resistance value was calculated in the same manner as in Example 11, it was 0.083Ω/□.

TABLE 14

| | Sheet resistance value (Ω/□) | | | |
|---|---|---|---|---|
| Support | Immediately after printing | 2 min allowing to stand under 50° C. and 80% Rh | 1 hour allowing to stand under 50° C. and 80% Rh | Remarks |
| 17 | 0.6 | 0.25 | 0.18 | Present invention |
| 15 | No conductivity | No conductivity | No conductivity | Comparative |

As can be clearly seen from Table 14, when the support 17 which belongs to the present invention is used, as compared with the theoretical sheet resistance value calculated from the silver amount, the value lowers 7-times immediately after the printing, 3-times when allowing to stand under the conditions of 50° C. and 80% Rh for 2 minutes, and an extremely low resistance value of about 2-times when allowing to stand under the conditions of 50° C. and 80% Rh for 1 hour. In the support 15 containing no water-soluble halogen compound, no conductivity is shown. In the support 17 of Example 1 using the same Metal colloid 4, it showed 12-times of the resistance value of the theoretical sheet resistance value calculated from the silver amount, so that the evaluation result was Δ, but in the present test, it showed a lower resistance value of 7-times. This can be considered due to the reason that Metal colloid 4 was diluted when preparing Silver ink 1 whereby a time until Silver ink 1 had been dried on the support 17 became long so that the similar effects as in the case of acting water after formation of the conductive material could be obtained.

The invention claimed is:

1. A process for preparing a conductive material having a conductive pattern containing silver on a support, which process for preparing a conductive material comprises acting at least one of the following mentioned (I) to (IV) on the pattern portion containing silver provided on the support:
(I) a reducing substance
(II) a water-soluble phosphorus oxo acid compound
(III) a water-soluble halogen compound
(IV) warm water of 55° C. or higher.

2. The process for preparing a conductive material according to claim 1, wherein the pattern portion containing silver provided on the support is a pattern portion containing silver formed by pattern-wisely exposing a silver salt light-sensitive material having at least one silver halide emulsion layer on the support, and subjecting to development.

3. The process for preparing a conductive material according to claim 2, wherein a half-value width of a peak at 2θ=38.2° of an obtained conductive pattern by an X-ray diffraction method is 0.41 or less.

4. The process for preparing a conductive material according to claim 1, wherein the pattern portion containing silver provided on the support is a pattern portion containing silver formed by providing ultra fine silver particles which have been dispersed in water and/or an organic solvent as a metal colloid to the support.

5. The process for preparing a conductive material according to claim 4, wherein the support has a porous layer comprising inorganic fine particles and a binder in an amount of 80% by weight or less based on the amount of the inorganic fine particles on the substrate.

6. The process for preparing a conductive material according to claim 4, wherein at least one of the above-mentioned (I) to (IV) is acted on the pattern portion containing silver provided on the support, and then water is further supplied to.

7. The process for preparing a conductive material according to claim 1, wherein (I) the reducing substance is a substance which can reduce a silver ion selected from the group consisting of polyhydroxybenzenes, ascorbic acid and its derivative(s), 3-pyrazolidones, aminophenols, polyaminobenzenes and hydroxylamines.

8. The process for preparing a conductive material according to claim 7, wherein (I) the reducing substance is ascorbic acid.

9. The process for preparing a conductive material according to claim 7, wherein (I) the reducing substance is used as an aqueous solution having a temperature which is 40° C. or higher but no greater than the Tg of the support.

10. The process for preparing a conductive material according to claim 1, wherein (II) the water-soluble phosphorus oxo acid compound is selected from the group consisting of phosphorus oxo acids, a salt thereof, and an ester compound thereof.

11. The process for preparing a conductive material according to claim 10, wherein (II) the water-soluble phosphorus oxo acid compound is used as an aqueous solution having a temperature which is 40° C. or higher but no greater than the Tg of the support.

12. The process for preparing a conductive material according to claim 1, wherein (III) the water-soluble halogen compound is selected from the group consisting of hydrogen halides, inorganic or organic salts thereof, and inorganic or organic polymerized halides.

13. The process for preparing a conductive material according to claim 12, wherein (III) the water-soluble halogen compound is an inorganic salt of hydrogen halides.

14. The process for preparing a conductive material according to claim 12, wherein (III) the water-soluble halogen compound is used as an aqueous solution having a temperature which is 30° C. or higher but no greater than the Tg of the support.

15. The process for preparing a conductive material according to claim 1, wherein (IV) the warm water has a temperature which is 65° C. or higher but no greater than the Tg of the support.

16. The process for preparing a conductive material according to claim 2, wherein the process is a development by a silver salt diffusion transfer method comprising the steps where an image is precipitated by the silver salt diffusion transfer development, then unnecessary silver halide emulsion layer is removed by a removal step by washing with water, and the conductive material is dried by a drying step, and the step of acting at least one of (I) to (IV) is carried out after completion of the removal step by washing with water and before the drying step.

17. The process for preparing a conductive material according to claim 16, wherein washing is carried out after the step of acting at least one of (I) to (IV) so as to not precipitate the components of the solution of the step of acting at least one of (I) to (IV) on the surface of the conductive material, and then subjecting the conductive material to a drying treatment.

18. The process for preparing a conductive material according to claim 4, wherein the step of acting at least one of (I) to (III) on the pattern portion containing silver is a method in which at least one of the substances (I) to (III) themselves or a layer containing at least one of the substances (I) to (III) is previously formed on a whole surface or a necessary portion of a support, and a desired pattern shape is formed thereon by using a metal colloid solution.

19. The process for preparing a conductive material according to claim 4, wherein the step of acting at least one of (I) to (III) on the pattern portion containing silver is a method in which a desired pattern shape is formed on a support by using a metal colloid solution, then a solution containing at least one of the substances (I) to (III) is coated thereon, optionally by dipping.

20. The process for preparing a conductive material according to claim 4, wherein the step of acting at least one of (I) to (III) on the pattern portion containing silver is a method in which a metal colloid solution and a solution containing at least one of the substances (I) to (III) are mixed immediately before providing them on a support, and a desired pattern is formed on the support by using the same.

* * * * *